US007508715B2

(12) United States Patent
Lee

(10) Patent No.: US 7,508,715 B2
(45) Date of Patent: *Mar. 24, 2009

(54) COARSE/FINE PROGRAM VERIFICATION IN NON-VOLATILE MEMORY USING DIFFERENT REFERENCE LEVELS FOR IMPROVED SENSING

(75) Inventor: Shih-Chung Lee, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/773,032

(22) Filed: Jul. 3, 2007

(65) Prior Publication Data
US 2009/0010067 A1 Jan. 8, 2009

(51) Int. Cl.
*G11C 16/00* (2006.01)

(52) U.S. Cl. .............................. 365/185.18; 365/185.22; 365/185.2

(58) Field of Classification Search ................ 365/204
See application file for complete search history.

(56) References Cited

U.S. PATENT DOCUMENTS

| 4,357,685 A | | 11/1982 | Daniele et al. | |
|---|---|---|---|---|
| 4,627,027 A | | 12/1986 | Rai et al. | |
| 5,053,990 A | | 10/1991 | Kreifels et al. | |
| 5,122,985 A | * | 6/1992 | Santin | 365/185.19 |
| 5,220,531 A | | 6/1993 | Blyth et al. | |
| 5,313,421 A | | 5/1994 | Guterman et al. | |
| 5,386,422 A | | 1/1995 | Endoh et al. | |
| 5,412,601 A | | 5/1995 | Sawada et al. | |
| 5,428,568 A | * | 6/1995 | Kobayashi et al. | 365/185.24 |
| 5,469,444 A | * | 11/1995 | Endoh et al. | 714/722 |
| 5,521,865 A | | 5/1996 | Ohuchi et al. | |
| 5,528,546 A | * | 6/1996 | Chao et al. | 365/185.21 |
| 5,570,315 A | | 10/1996 | Tanaka et al. | |

(Continued)

FOREIGN PATENT DOCUMENTS

EP 0877386 11/1998

(Continued)

OTHER PUBLICATIONS

Kurata, Hideaki, et al., "Constant-Charge-Injection Programming for 10MB/s Multilevel AG-AND Flash Memories," 2002 Symposium On VLSI Circuits Digest of Technical Papers, pp. 302-303.

(Continued)

*Primary Examiner*—Tan T. Nguyen
(74) *Attorney, Agent, or Firm*—Vierra Magen Marcus & DeNiro LLP

(57) ABSTRACT

Coarse/fine programming of non-volatile memory is provided in which memory cells are programmed at a first rate of programming prior to reaching a coarse verify level for their intended state and a second rate of programming after reaching the coarse verify level but before reaching the final verify level for their intended state. Large sub-threshold swing factors associated with smaller memory cells can affect the accuracy of sense operations, particularly when sensing at a fine verify level after sensing at a coarse verify level without pre-charging the bit line between the different sensings. Different reference potentials are utilized when sensing at a coarse verify level and a final verify level. The different between the reference potentials can compensate for any discharge of the bit line during the coarse level sensing.

22 Claims, 14 Drawing Sheets

U.S. PATENT DOCUMENTS

| | | | |
|---|---|---|---|
| 5,596,532 A | | 1/1997 | Cernea et al. |
| 5,623,442 A | | 4/1997 | Gotou et al. |
| 5,652,719 A | | 7/1997 | Tanaka et al. |
| 5,712,180 A | | 1/1998 | Guterman et al. |
| 5,712,815 A | | 1/1998 | Bill et al. |
| 5,729,494 A | | 3/1998 | Gotou et al. |
| 5,761,222 A | | 6/1998 | Baldi |
| 5,768,191 A | * | 6/1998 | Choi et al. ............. 365/185.22 |
| 5,808,938 A | | 9/1998 | Tran et al. |
| 5,870,334 A | | 2/1999 | Hemink et al. |
| 5,870,344 A | | 2/1999 | Ozawa |
| 5,877,984 A | | 3/1999 | Engh |
| 5,880,993 A | | 3/1999 | Kramer et al. |
| 5,909,393 A | | 6/1999 | Tran et al. |
| 5,912,836 A | | 6/1999 | Liu et al. |
| 5,926,409 A | | 7/1999 | Engh et al. |
| 5,943,260 A | | 8/1999 | Hirakawa et al. |
| 5,949,714 A | | 9/1999 | Hemink et al. |
| 5,969,986 A | | 10/1999 | Wong et al. |
| 5,969,990 A | | 10/1999 | Arase |
| 5,991,202 A | | 11/1999 | Derhacobian et al. |
| 6,091,637 A | * | 7/2000 | Hakozaki ............... 365/185.22 |
| 6,125,052 A | | 9/2000 | Tanaka |
| 6,128,224 A | | 10/2000 | Morton et al. |
| 6,151,248 A | | 11/2000 | Harari et al. |
| 6,222,762 B1 | | 4/2001 | Guterman et al. |
| 6,243,290 B1 | | 6/2001 | Kurata et al. |
| 6,266,270 B1 | | 7/2001 | Nobukata |
| 6,278,632 B1 | | 8/2001 | Chevallier |
| 6,278,634 B1 | | 8/2001 | Ra |
| 6,292,394 B1 | | 9/2001 | Cohen et al. |
| 6,301,151 B1 | | 10/2001 | Engh et al. |
| 6,301,161 B1 | * | 10/2001 | Holzmann et al. ..... 365/189.07 |
| 6,317,364 B1 | | 11/2001 | Guterman et al. |
| 6,343,033 B1 | | 1/2002 | Parker |
| 6,344,993 B1 | | 2/2002 | Harari et al. |
| 6,363,010 B2 | | 3/2002 | Tanaka et al. |
| 6,392,931 B1 | | 5/2002 | Pasotti et al. |
| 6,424,566 B1 | | 7/2002 | Parker |
| 6,504,761 B2 | | 1/2003 | Kai et al. |
| 6,519,184 B2 | | 2/2003 | Tanaka et al. |
| 6,522,580 B2 | | 2/2003 | Chen et al. |
| 6,525,964 B2 | | 2/2003 | Tanaka et al. |
| 6,529,412 B1 | | 3/2003 | Chen et al. |
| 6,532,172 B2 | | 3/2003 | Harari et al. |
| 6,590,811 B1 | | 7/2003 | Hamilton et al. |
| 6,643,188 B2 | | 11/2003 | Tanaka et al. |
| 6,674,668 B2 | | 1/2004 | Ikehashi et al. |
| 6,735,114 B1 | | 5/2004 | Hamilton et al. |
| 6,738,289 B2 | | 5/2004 | Gongwer et al. |
| 6,747,892 B2 | | 6/2004 | Khalid |
| 6,785,164 B2 | | 8/2004 | Gonzalez et al. |
| 6,788,579 B2 | | 9/2004 | Gregori et al. |
| 6,809,962 B2 | | 10/2004 | Uribe et al. |
| 6,829,167 B2 | | 12/2004 | Tu et al. |
| 6,853,585 B2 | * | 2/2005 | Lee et al. ............... 365/185.22 |
| 6,856,551 B2 | | 2/2005 | Mokhlesi et al. |
| 6,859,397 B2 | | 2/2005 | Lutze et al. |
| 6,888,758 B1 | | 5/2005 | Hemink et al. |
| 6,894,929 B2 | | 5/2005 | Matsuoka et al. |
| 6,924,663 B2 | | 8/2005 | Masui et al. |
| 6,952,365 B2 | | 10/2005 | Gonzalez et al. |
| 6,958,934 B2 | | 10/2005 | Fan et al. |
| 7,002,843 B2 | | 2/2006 | Guterman et al. |
| 7,020,026 B2 | | 3/2006 | Guterman et al. |
| 7,023,733 B2 | | 4/2006 | Guterman et al. |
| 7,068,539 B2 | | 6/2006 | Guterman et al. |
| 7,088,621 B2 | | 8/2006 | Guterman et al. |
| 7,092,290 B2 | | 8/2006 | Hemink |
| 7,139,198 B2 | * | 11/2006 | Guterman et al. ...... 365/185.22 |
| 7,173,859 B2 | | 2/2007 | Hemink |
| 2001/0040824 A1 | | 11/2001 | Banks |
| 2004/0057326 A1 | | 3/2004 | Ikehashi et al. |
| 2004/0109352 A1 | | 6/2004 | Lee et al. |
| 2004/0141377 A1 | | 7/2004 | Arai et al. |
| 2005/0057965 A1 | | 3/2005 | Cernea et al. |
| 2005/0057967 A1 | | 3/2005 | Khalid et al. |
| 2005/0057968 A1 | | 3/2005 | Lutze et al. |
| 2005/0083735 A1 | | 4/2005 | Chen et al. |

FOREIGN PATENT DOCUMENTS

| | | |
|---|---|---|
| EP | 1225596 | 7/2002 |
| EP | 1249842 | 10/2002 |
| EP | 1341185 | 9/2003 |
| WO | 9828745 | 7/1998 |
| WO | WO2006/107651 A | 10/2006 |

OTHER PUBLICATIONS

Johnson, William S., et al., "Session XII: ROMs, PROMs and EFROMs," 1980 IEEE International Solid-State Circuits Conference, pp. 152-153.

Nobukata, Hiromi, et al., "A 144-Mb 8 Level NAND Flash Memory with Optimized Pulse Width Programming," 1999 Symposium on VLSI Circuits Digest of Technical Papers, pp. 39-40.

Ohkawa, Masayoshi, et al., "TP 2.3: A 98mm2 3.3V 64Mb Flash Memory with FN-NOR Type 4-level Cell," 1996 IEEE International Solid-State Circuits Conference, pp. 36-37.

Takeuchi, et al., "A Source-line Programming Scheme for Low Voltage Operation NAND Flash Memories," 1999 Symposium on VLSI Circuits Digest of Technical Papers, pp. 37-38.

Hosono, et al., "A High Speed Failure Bit Counted for the Pseudo Pass Scheme (PPS) in Program Operation for Giga Bit NAND Flash," Toshiba Corporation, pp. 23-26.

Choi, et al., "A Novel Booster Plate Technology in High Density NAND Flash Memories for voltage Scaling-down and Zero Program Disturbance," Samsung Electronics Co., Ltd., pp. 238-239.

U.S. Appl. No. 11/773,035, filed Jul. 3, 2007.

Preliminary Amendment, U.S. Appl. No. 11/773,035, filed Jul. 3, 2007, Oct. 28, 2008.

International Search Report & The Written Opinion of the International Searching Authority, Patent Cooperation Treaty, Application No. PCT/US2008/068988 filed on Jul. 2, 2008, Oct. 13, 2008.

Notice of Allowance and Fee(s) Due, United States Patent & Trademark Office, U.S. Appl. No. 11/773,0035 filed Jul. 3, 2007, Jan. 13, 2009.

* cited by examiner

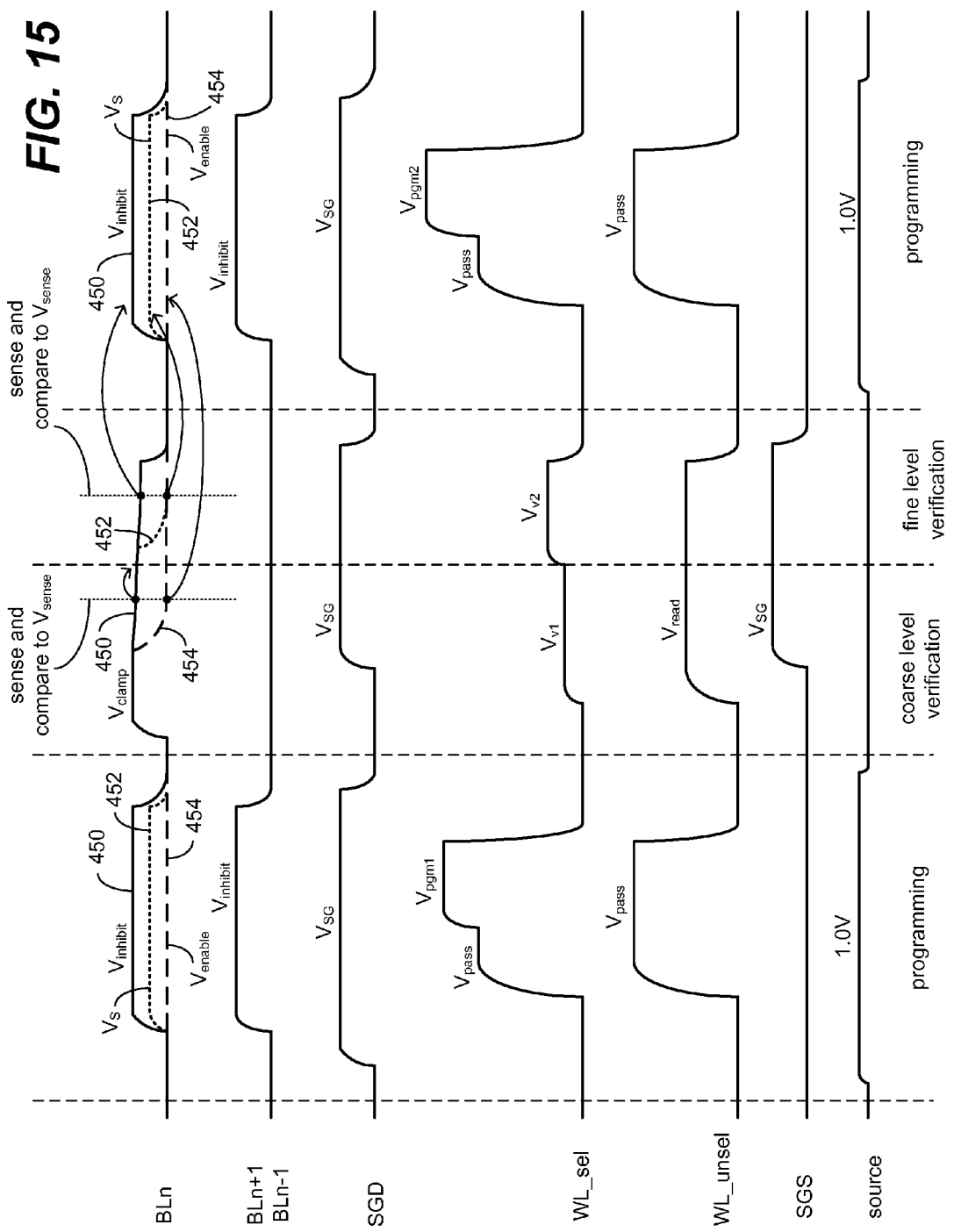

memory device with small S-factor memory device with large S-factor

COARSE/FINE PROGRAM VERIFICATION IN NON-VOLATILE MEMORY USING DIFFERENT REFERENCE LEVELS FOR IMPROVED SENSING

CROSS-REFERENCE TO RELATED APPLICATIONS

The following application is cross-referenced and incorporated by reference herein in its entirety:

U.S. patent application Ser. No. 11/773,035, entitled "Systems for Coarse/Fine Program Verification in Non-Volatile Memory Using Different Reference Levels for Improved Sensing," by Shih-Chung Lee, filed concurrently.

BACKGROUND OF THE INVENTION

1. Field of the Invention

The present disclosure relates to programming in non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

EEPROM and EPROM memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. The minimum amount of voltage that must be applied to the control gate before the transistor is turned on to permit conduction between its source and drain is controlled by the level of charge on the floating gate.

When programming a flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state.

Some EEPROM and flash memory devices have a floating gate that is used to store two ranges of charges and, therefore, the memory cell can be programmed/erased between two states (an erased state and a programmed state). For example, FIG. 1 shows a graph depicting two threshold voltage distributions. The x axis plots threshold voltage and the y axis plots the number of memory cells. The threshold voltages in distribution 2 are less than zero volts. In one embodiment, threshold voltage distribution 2 corresponds to erased memory cells that store data "1." The threshold voltages in distribution 4 are greater than zero volts. In one embodiment, threshold voltage distribution 4 corresponds to programmed memory cells that store data "0."

A multi-state flash memory cell is implemented by identifying multiple, distinct allowed threshold voltage ranges separated by forbidden voltage ranges. Each distinct threshold voltage range corresponds to a predetermined value for the set of data bits. FIG. 2 illustrates threshold voltage distributions for memory cells storing two bits of data through the use of four data states. In one embodiment, threshold voltage distribution 2 represents memory cells that are in the erased state (e.g., storing "11"), having negative threshold voltage levels. Threshold voltage distribution 10 represents memory cells that store data "10," having positive threshold voltage levels. Threshold voltage distribution 12 represents memory cells storing data "00." Threshold voltage distribution 14 represents memory cells that are storing "01." In some implementations (as exemplified above), these data values (e.g. logical states) are assigned to the threshold ranges using a gray code assignment so that if the threshold voltage of a floating gate erroneously shifts to its neighboring physical state, only one logical bit will be affected. In other embodiments, each of the distributions can correspond to different data states than described above. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, embodiments in accordance with the present disclosure are applicable to memory cells that store more than two bits of data.

Threshold voltage distributions 2 and 4 show the erased and programmed voltage-distributions when no verify operations are used. These distributions can be obtained by programming or erasing the memory cells with one single programming or erase pulse. Depending on the memory array size and the variations in the production process, threshold voltage distribution 4 will have a certain width, known as the natural $V_{th}$ width.

As can be seen from FIG. 2, distributions 10, 12, and 14 (corresponding to programming a multi-state device) need to be much narrower than the natural $V_{th}$ width of distribution 4. To achieve narrower threshold voltage distributions, a process that uses multiple programming pulses and verify operations, such as that described by FIGS. 3A, 3B, and 3C, can be used.

FIG. 3A depicts a programming voltage signal $V_{pgm}$ that is applied to the control gate as a series of pulses. The magnitude of the pulse is increased with each successive pulse by a pre-determined step size (e.g., 0.2V-0.4V), depicted in FIG. 3A as $\Delta V_{pgm}$. In the periods between the pulses, verify operations are carried out. As the number of programmable states increases, the number of verify operations increases and more time is needed. One means for reducing the time-burden is a more efficient verification process, such as the process that is disclosed in U.S. patent application Ser. No. 10/314,055 entitled, "Smart Verify For Multi-State Memories," filed Dec. 5, 2002, incorporated herein by reference in its entirety. In reality, the pulses of FIG. 3A are separated from each other by a time period during which verification is performed. However, to make FIG. 3 more readable, the time period for verification is omitted from the drawing.

FIG. 3B depicts the voltage signal applied to a bit line for the associated memory cell being programmed. FIG. 3C depicts the threshold voltage of the memory cell being programmed. Note that the graph in FIG. 3C is smoothed out to make it easier to read. After each programming pulse, a verify operation is carried out (not shown.) During the verify operation, the threshold voltage of the memory cell to be programmed is checked. If the threshold voltage of the memory cell is larger than the target value (e.g., $V_{verify}$), then programming for that memory cell is inhibited in the next cycle by raising the bit line voltage from 0v to $V_{inhibit}$ (e.g., at time $t_4$).

As with other electronic devices, there is a consumer demand for memory devices to program as fast as possible. For example, the user of a digital camera that stores images on a flash memory card does not want to wait between pictures for an unnecessary long period of time. In addition to programming with reasonable speed, to achieve proper data storage for a multi-state memory cell, the multiple ranges of threshold voltages of the multi-state memory cells should be separated from each other by sufficient margin so that the level of the memory cell can be programmed and read in an unambiguous manner. A tight threshold voltage distribution is recommended. To achieve a tight threshold voltage distribution, small program steps have typically been used, thereby programming the threshold voltage of the cells more slowly. The tighter the desired threshold voltage distribution the smaller the steps and the slower the programming process.

One solution for achieving tight threshold voltage distributions, without unreasonably slowing down the programming process, includes using a two-phase programming process. The first phase, a coarse programming phase, includes an attempt to raise a threshold voltage in a faster manner while paying less attention to achieving a tight threshold voltage distribution. The second phase, a fine programming phase, attempts to raise the threshold voltage in a slower manner in order to reach the target threshold voltage, thus achieving a tighter threshold voltage distribution. One example of a coarse/fine programming methodology can be found in U.S. Pat. No. 6,643,188, incorporated herein by reference in its entirety.

FIGS. 4 and 5 provide more detail of one example of a coarse/fine programming methodology. FIGS. 4A and 5A depict the programming pulses $V_{pgm}$ applied to the control gate. FIGS. 4B and 5B depict the bit line voltages for the memory cells being programmed. FIGS. 4C and 5C depict the threshold voltage of the memory cells being programmed. The example of FIGS. 4 and 5 depicts programming of memory cells to state A using two verify levels, indicated in the Figures as $V_{vA1}$ and $V_{vA2}$. The final target level is $V_{vA2}$. When a threshold voltage of the memory cell has reached $V_{vA2}$, the memory cell will be inhibited from further programming by applying an inhibit voltage to the bit line corresponding to that memory cell. For example, the bit line voltage can be raised to $V_{inhibit}$ (See FIG. 4B and FIG. 5B). However, when a memory cell has reached a threshold voltage close to (but lower than) the target value $V_{vA2}$, the threshold voltage shift of the memory cell during subsequent programming pulses is slowed down by applying a certain bias voltage to the bit line, typically on the order of 0.3V to 0.8V. Because the rate of threshold voltage shift is reduced during the next few programming pulses, the final threshold voltage distribution can be narrower than with the methods depicted in FIG. 3. To implement this method, a second verify level that is lower than that of $V_{vA2}$ is used. This second verify level is depicted in FIGS. 4 and 5 as $V_{vA1}$. When the threshold voltage of the memory cell is larger than $V_{vA1}$, but still lower than $V_{vA2}$, the threshold voltage shift to the memory cell will be reduced for subsequent programming pulses by applying a bit line bias $V_s$ (FIG. 5B). Note that in this case, two verify operations are required for each state. One verify operation at the corresponding final verify level (e.g., $V_{vA2}$) for each state to which the coarse/fine programming methodology is applied, and one verify operation at the corresponding second verify level (e.g., $V_{vA1}$) for each state. This may increase the total time needed to program the memory cells. However, a larger $\Delta V_{pgm}$ step size can be used to speed up the process.

FIGS. 4A, 4B, and 4C show the behavior of a memory cell whose threshold voltage moves past $V_{vA1}$ and $V_{vA2}$ in one programming pulse. For example, the threshold voltage is depicted in FIG. 4C to pass $V_{vA1}$ and $V_{vA2}$ in between $t_2$ and $t_3$. Thus, prior to $t_3$, the memory cell is in the coarse phase. After t3, the memory cell is in the inhibit mode.

FIGS. 5A, 5B, and 5C depict a memory cell that enters both the coarse and fine programming phases. The threshold voltage of the memory cell crosses $V_{vA1}$ in between time $t_2$ and time $t_3$. Prior to $t_3$, the memory cell is in the coarse phase. After $t_3$, the bit line voltage is raised to Vs to place the memory cell in the fine phase. In between $t_3$ and $t_4$, the threshold voltage of the memory cell crosses $V_{vA2}$. Therefore, the memory cell is inhibited from further programming by raising the bit line voltage to $V_{inhibit}$.

Typically, in order to maintain reasonable programming times, coarse/fine programming algorithms are not applied to the highest memory state (the state corresponding to the largest positive threshold voltage range). The highest state, such as state C represented by distribution 14 in FIG. 2, does not need to be differentiated from a higher state. Typically, it is only necessary to program cells for this state above a minimum threshold level to differentiate from the next lowest state (e.g., state B represented by distribution 12). Thus, the distribution of these cells can occupy a wider threshold voltage range without adverse effects on device performance. However, some implementations will make use of coarse/fine programming techniques when programming the highest level state as well.

SUMMARY OF THE INVENTION

The technology described herein attempts to provide a more accurate sensing of the threshold voltage of non-volatile storage elements during programming verification when coarse/fine programming is utilized.

Coarse/fine programming of non-volatile memory is provided in which memory cells are programmed at a first rate of programming prior to reaching a coarse verify level for their intended state and a second rate of programming after reaching the coarse verify level but before reaching the final verify level for their intended state. Large sub-threshold swing factors associated with smaller memory cells can affect the accuracy of sense operations, particularly when sensing at a fine verify level after sensing at a coarse verify level without pre-charging the bit line between the different sensings. Different reference potentials are utilized when sensing at a coarse verify level and a final verify level. The difference between the reference potentials can compensate for any discharge of the bit line during the coarse level sensing.

One embodiment includes a method of programming non-volatile memory. The method includes applying one or more programming pulses to a set of non-volatile storage elements to program one or more storage elements of the set to a particular state. After applying each programming pulse, programming of the one or more storage elements to an intermediate verify level corresponding to the particular state is verified by applying a first voltage to the set of storage elements and comparing a bit line voltage of each of the one or more storage elements to a first reference potential. After applying each programming pulse, verifying programming of the one or more storage elements to a final verify level corresponding to the particular state is preformed by applying a second voltage to the set of storage elements and comparing the bit line voltage of each of the one or more storage elements to a second reference potential, the second reference potential compensates for a decrease in the bit line voltage of each of the one or more storage elements resulting from the verifying programming to the intermediate verify level.

In another embodiment, a method of verifying programming of non-volatile storage is provide that includes charging a bit line corresponding to a non-volatile storage element, applying to the non-volatile storage element an intermediate verify voltage corresponding to a target state for the non-volatile storage element, sensing a voltage of the bit line while the intermediate verify voltage is applied, comparing the voltage of the bit line to a first reference potential, applying to the non-volatile storage element a final verify voltage corresponding to the target state for the non-volatile storage element, sensing the voltage of the bit line while the final verify voltage is applied and before the bit line completely discharges from the charging, and comparing the voltage of the bit line while the final verify voltage is applied to a second reference potential.

One exemplary implementation includes a set of non-volatile storage elements and one or more managing circuits in communication with the set of non-volatile storage elements. The one or more managing circuits can perform the processes described above.

BRIEF DESCRIPTION OF THE DRAWINGS

FIG. 3A depicts a programming voltage signal that is applied to a control gate of a non-volatile storage element. FIG. 3B depicts a voltage signal applied to a bit line for a NAND string. FIG. 3C depicts the threshold voltage of the non-volatile storage element being programmed.

FIG. 15 is timing diagram describing various signals that may be applied to a memory device during a program and program verification operation.

DETAILED DESCRIPTION

Figure 1:
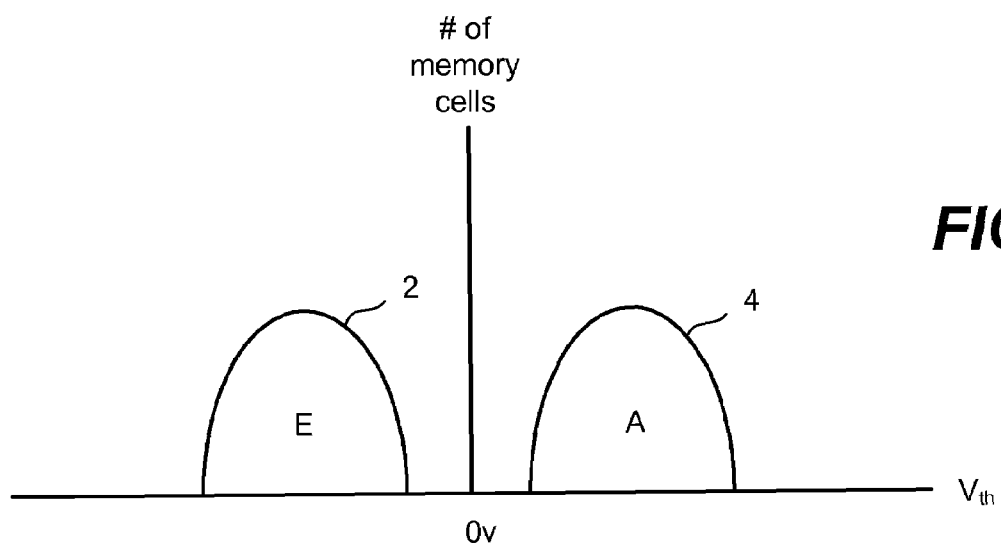
FIG. 1 is a graph depicting two threshold voltage distributions.
Figure 2:
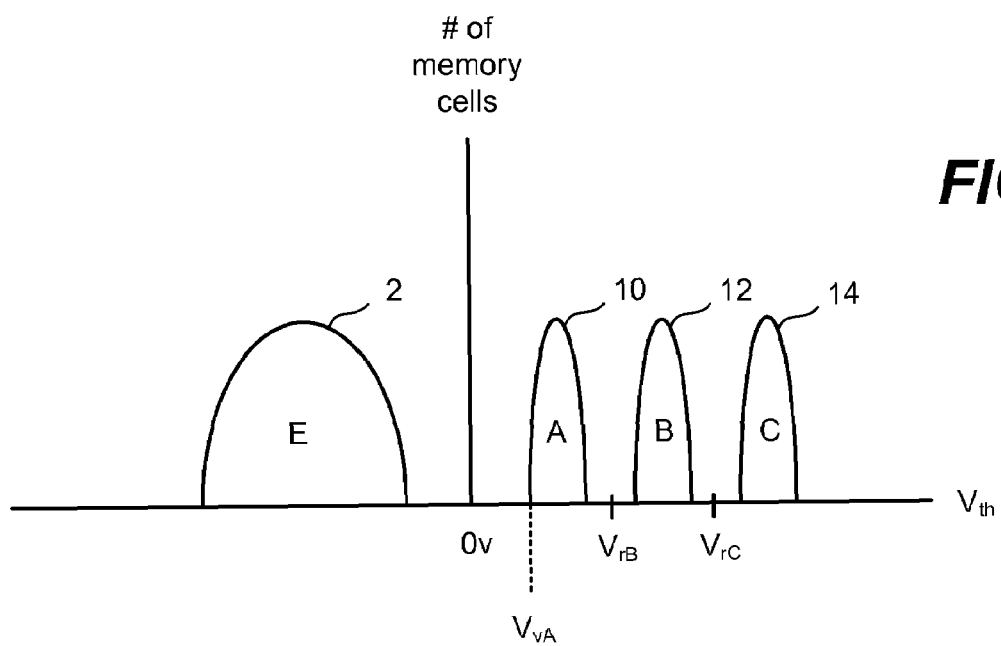
FIG. 2 is a graph depicting four threshold voltage distributions.
Figure 3C:
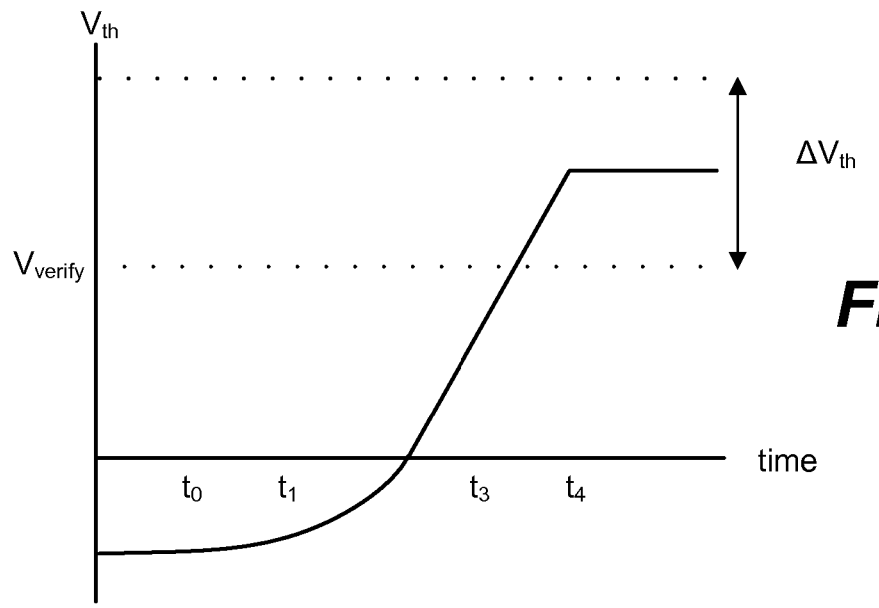
FIGS. 3A, 3B and 3C depict a programming process.
Figure 3B:
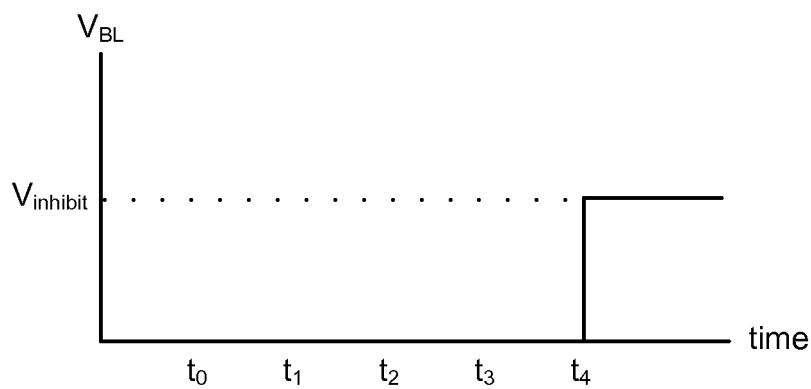
Figure 3A:
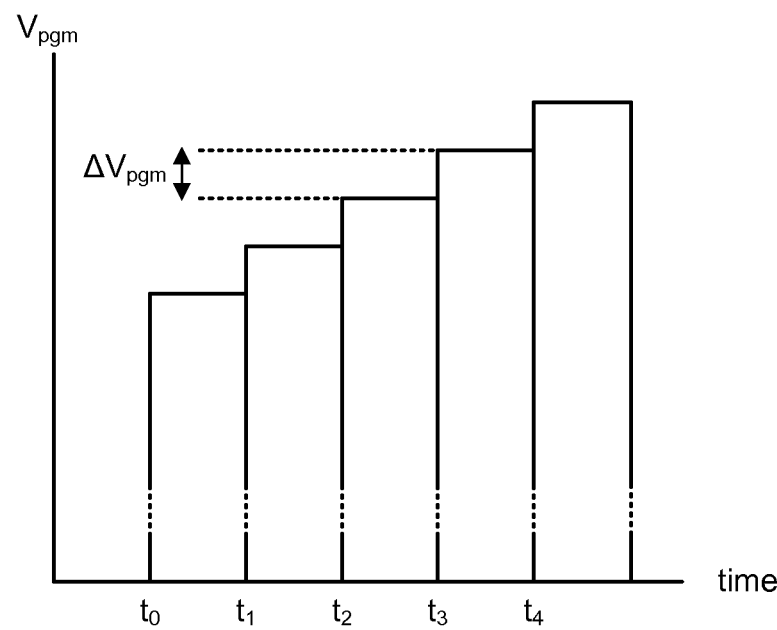
Figure 4C:
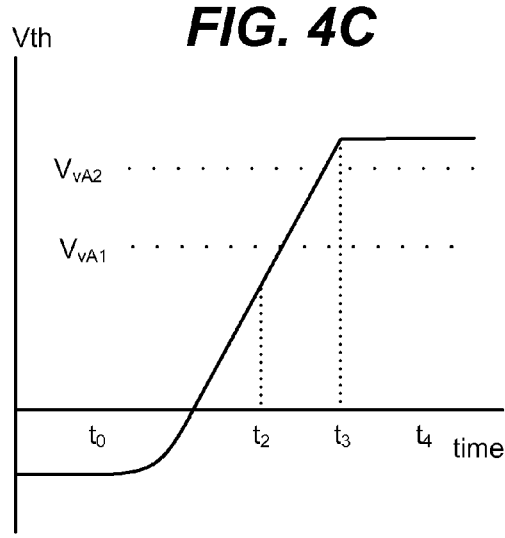
FIGS. 4A, 4B and 4C depict one embodiment of a programming process that is performed as part of coarse/fine programming.
Figure 5C:
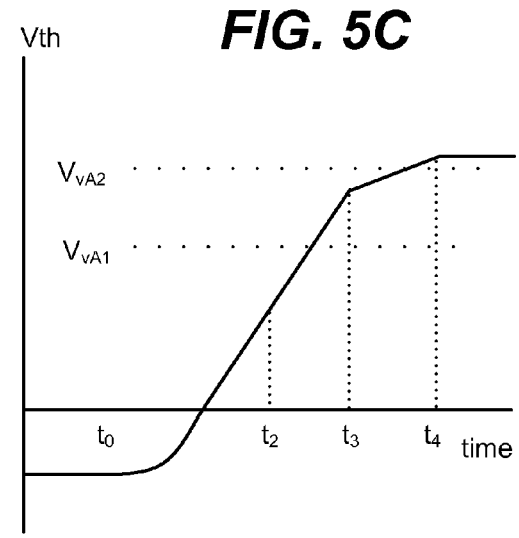
FIGS. 5A, 5B and 5C depict one embodiment of a programming process that is performed as part of coarse/fine programming.
Figure 4B:
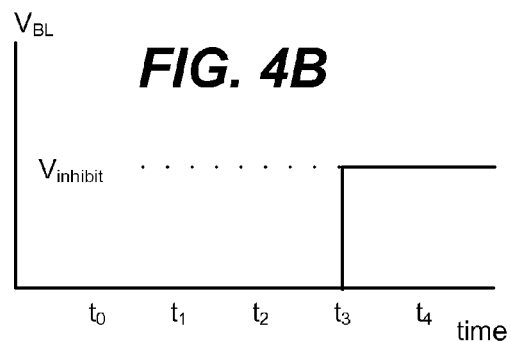
Figure 5B:
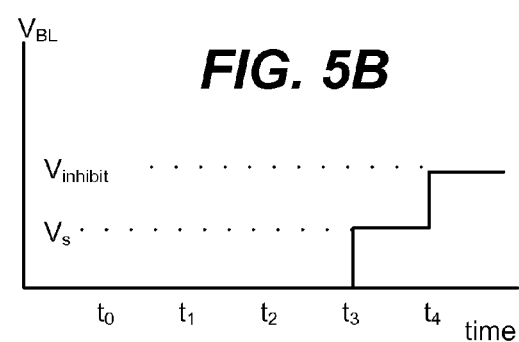
Figure 4A:
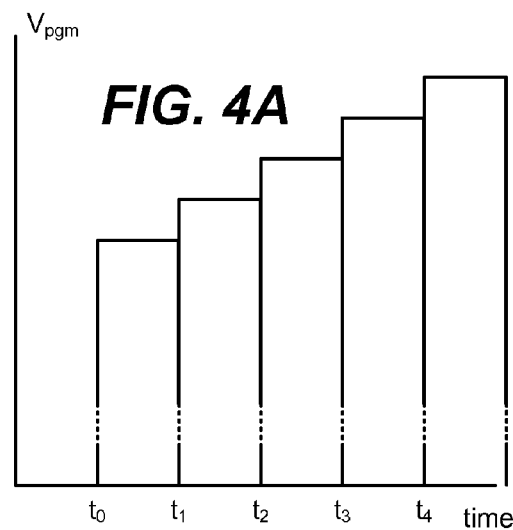
Figure 5A:
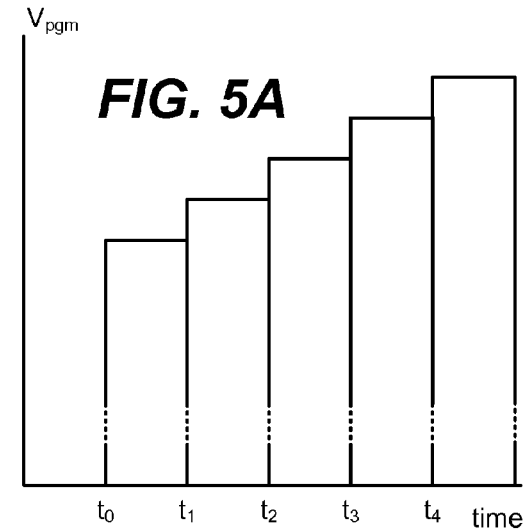
Figure 6:
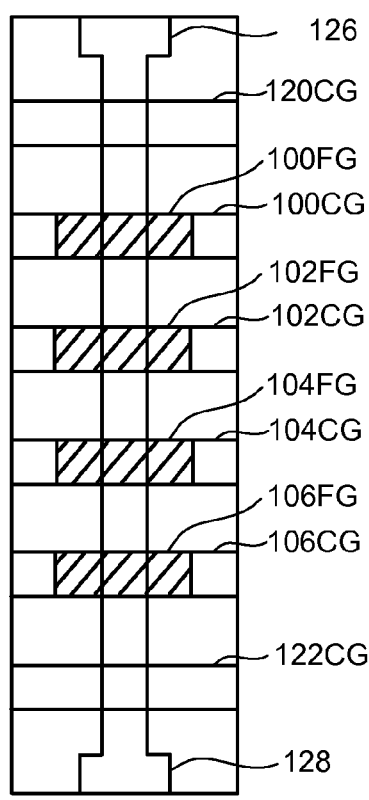
FIG. 6 is a top view of a NAND string.
Figure 7:
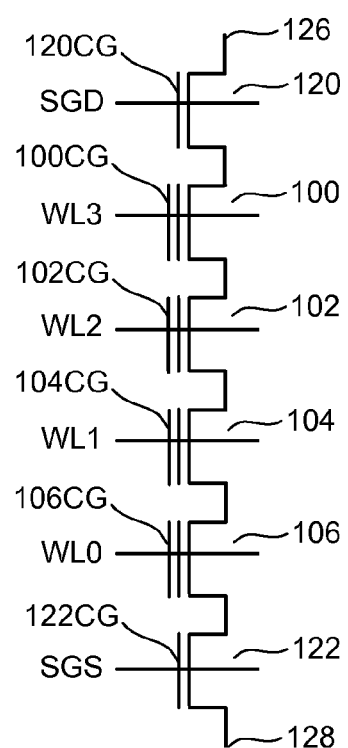
FIG. 7 is an equivalent circuit diagram of the NAND string of FIG. 6.

One example of a flash memory system suitable for implementing embodiments of the present disclosure uses the NAND structure, which includes multiple transistors arranged in series between two select gates. The transistors in series and the select gates are referred to as a NAND string. FIG. 6 is a top view showing one NAND string. FIG. 7 is an equivalent circuit thereof. The NAND string depicted in FIGS. 5 and 6 includes four transistors 100, 102, 104 and 106 in series and sandwiched between a select gate 120 and a second select gate 122. Select gate 120 connects the NAND string to bit line contact 126. Select gate 122 connects the NAND string to source line contact 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than those depicted in FIGS. 6 and 7. Select gate 120 is connected to select line SGD, and select gate 122 is connected to select line SGS.

Note that although FIGS. 6 and 7 show four memory cells in the NAND string, the use of four transistors is only provided as an example. A NAND string can have less than four memory cells or more than four memory cells. For example, some NAND strings will include 8 memory cells, 16 memory cells, 32 memory cells, etc. The discussion herein is not limited to any particular number of memory cells in a NAND string.

Relevant examples of NAND type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528 and U.S. patent application. Ser. No. 09/893,277 (Publication No. US2003/0002348). Information about programming NAND flash memory, including self boosting techniques, can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety. Other types of flash memory devices can also be used with the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

The technology described herein is not limited to floating gate types of memory. For example, the technology described herein can be used with memory devices that use various types of charge storage regions/layer(s) between the control gate (or word line) and the substrate, such as a non-conductive dielectric charge storage region or small silicon islands, better known as nano-crystals.

Figure 8:
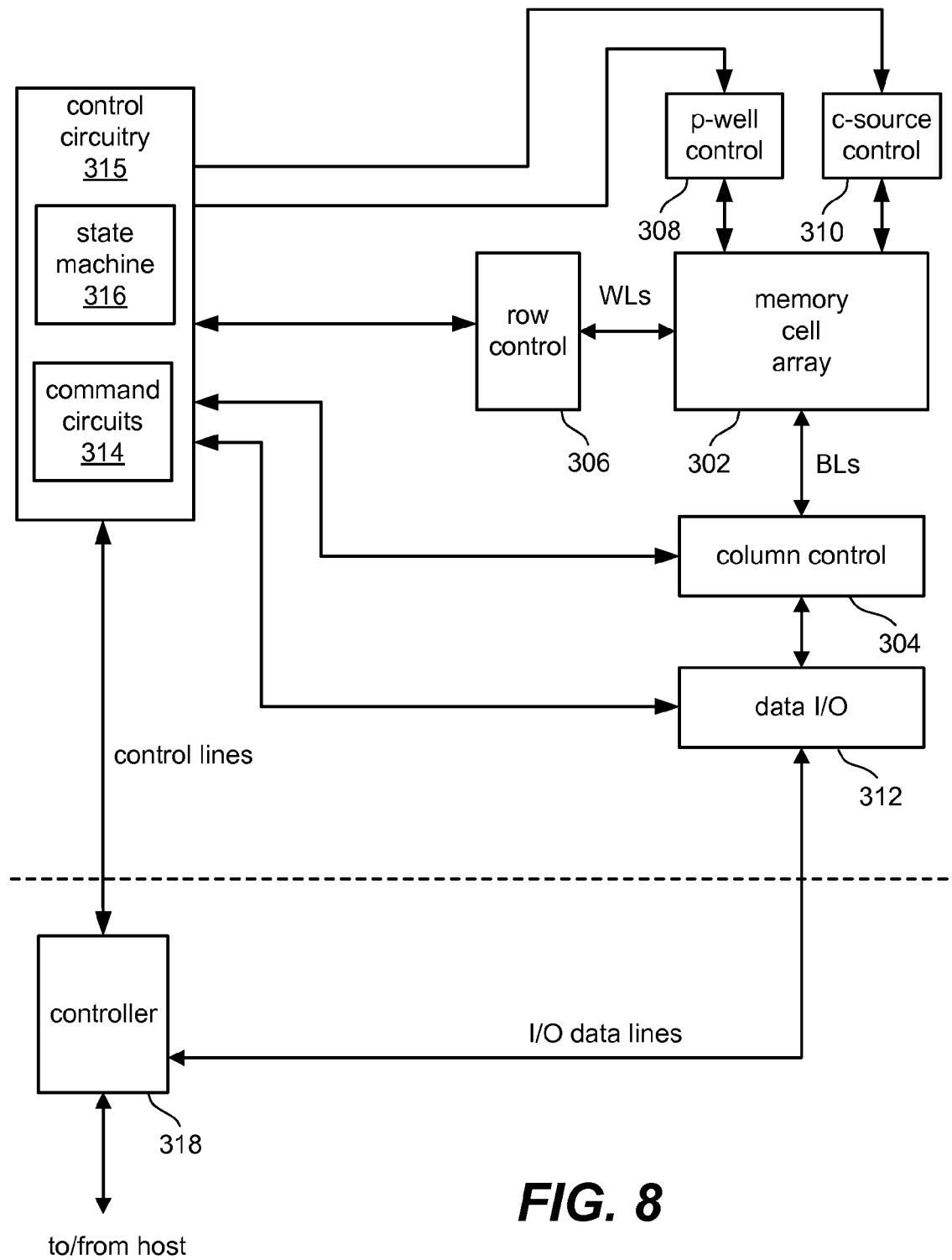
FIG. 8 is a block diagram of one embodiment of a non-volatile memory system.

FIG. 8 is a block diagram of one embodiment of a flash memory system that can be used to implement one or more embodiments of the present disclosure. FIG. 8 is exemplary as other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 9) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 8 can be combined. In various designs, one or more of the components of FIG. 8, other than memory cell array 302, can be thought of as managing circuitry for the memory system. For example, one or more managing circuits may include any one of or a combination of a command circuit, a state machine, a row control circuit, a column control circuit, a well control circuit, a source control circuit, a data I/O circuit, or a controller.

Figure 9:
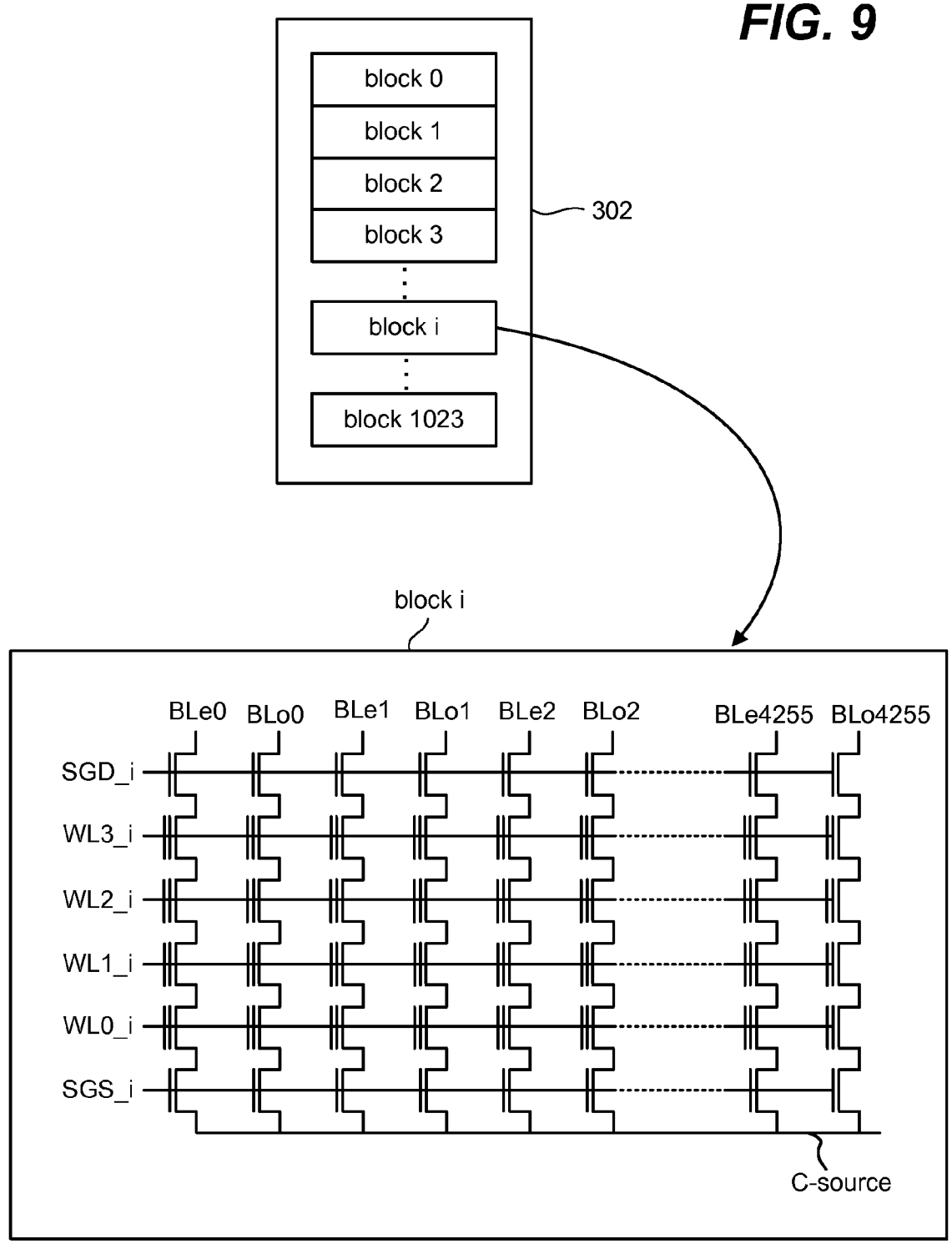
FIG. 9 illustrates an example of an organization of a memory array.

With reference to FIG. 9, an exemplary structure of memory cell array 302 is described. In this example, a NAND flash EEPROM is described that is partitioned into 1,024 blocks. The data stored in each block is simultaneously erased. In one embodiment, the block is the minimum unit of cells that are simultaneously erased. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 9 there are 8,512 columns that are divided into even columns and odd columns. The bit lines are also divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. Although four cells are shown to be included in each NAND string in FIG. 9, more or less than four memory cells can be used. One terminal of the NAND string is connected to a corresponding bit line via a first select transistor that is connected to a drain select gate control line SGD, and another terminal is connected to C-source via a second select transistor that is connected to a source select gate control line SGS.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time.

During one embodiment of read and programming operations in an odd/even bit line architecture, 4,256 memory cells are simultaneously selected. The memory cells selected have the same word line and the same kind of bit line (e.g. even bit lines or odd bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g., multi-state memory cells), wherein each of these two bits are stored in a different page, one block stores 16 logical pages. Other sized blocks and pages can also be used with the present invention. Additionally, architectures other than that of FIGS. 8 and 9 can also be used to embodiments of the present disclosure.

Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12V. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 2.5V) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

Figure 10:
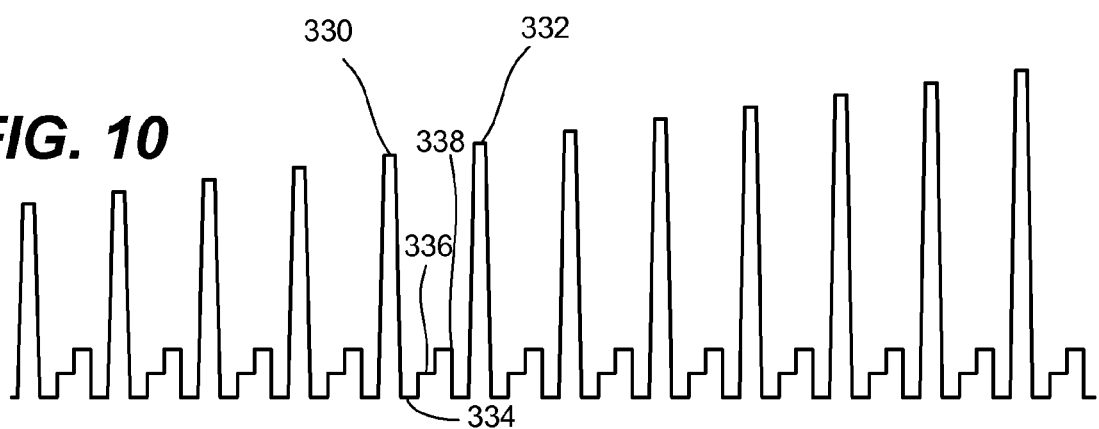
FIG. 10 depicts a program voltage signal, including verify pulses, that can be used in accordance with one embodiment.

FIG. 10 depicts a program voltage signal in accordance with one embodiment. This signal has a set of pulses with increasing magnitudes. The magnitude is increased with each pulse by a predetermined step size. In one embodiment that includes the memory cells storing multiple bits of data, an exemplary step size is 0.2V (or 0.4V). Between each of the program pulses are the verify pulses. The signal of FIG. 10 assumes a four state memory cell, therefore, it includes three verify pulses. For example, between programming pulses 330 and 332 are three sequential verify pulses. The first verify pulse 334 is depicted at a zero volt verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Method for Programming of Multi-State Non-Volatile Memory Using Smart Verify, filed Oct. 27, 2005; and U.S. patent application Ser. No. 11/260,658, entitled "Apparatus for Programming of Multi-State Non-Volatile Memory Using Smart Verify," filed Oct. 27, 2005, all of which are incorporated herein by reference in their entirety.

Figure 11:
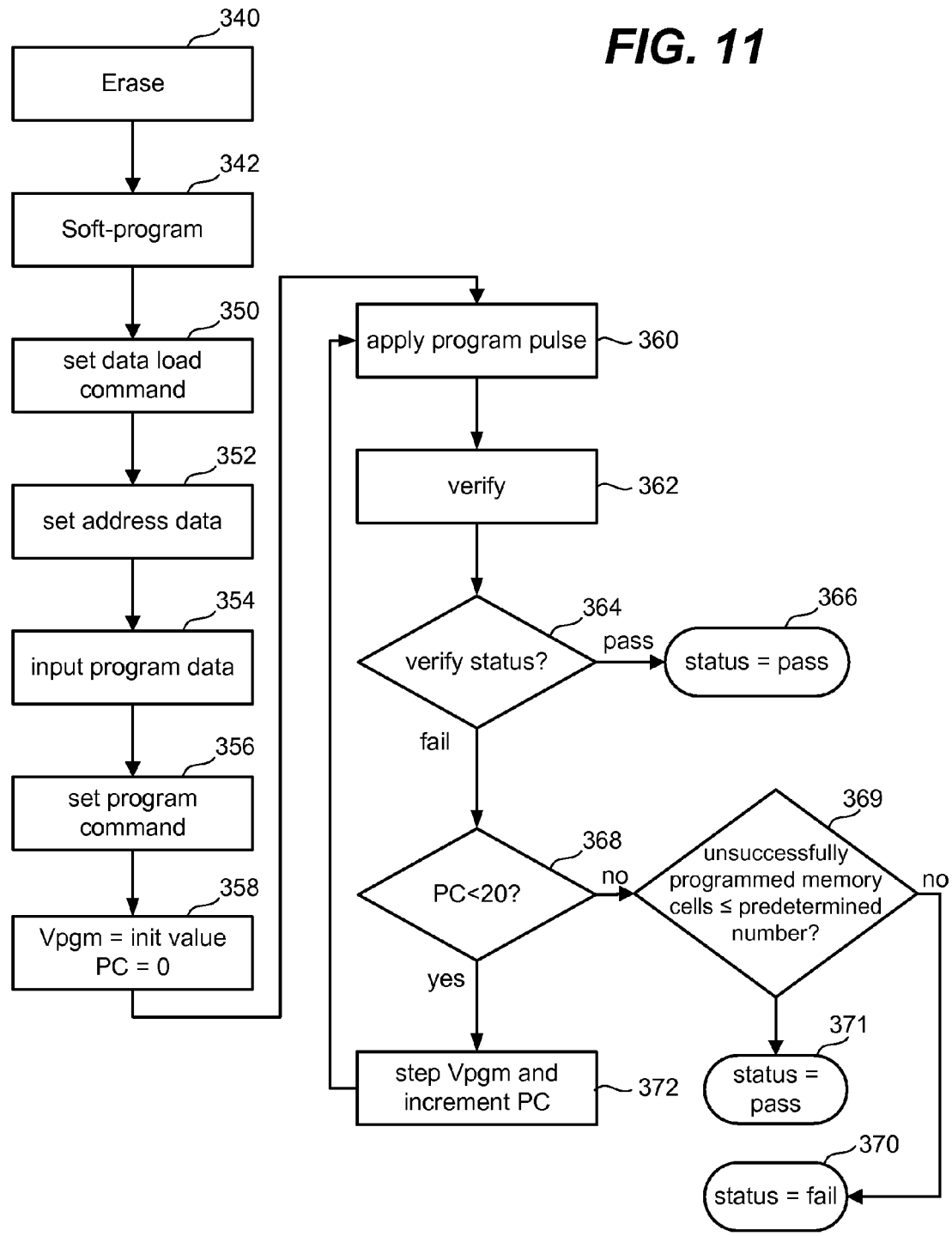
FIG. 11 is a flowchart describing a method of programming non-volatile memory in accordance with one embodiment.

FIG. 11 is a flow chart describing one embodiment of a method for programming non-volatile memory. The memory cells to be programmed are erased at step 340. Step 340 can include erasing more memory cells than those to be programmed (e.g., in blocks or other units). At step 342, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 350 of FIG. 11, a "data load" command is issued by controller 318 and input to command circuits 314, allowing data to be input to data input/output buffer 312. The input data is recognized as a command and latched by state machine 316 via a command latch signal, not illustrated, input to command circuits 314. At step 352, address data designating the page address is input to row controller or decoder 306 from the controller or host. The input data is recognized as the page address and latched via state machine 316, affected by the address latch signal input to command circuits 314. At step 354, a page of program data for the addressed page is input to data input/output buffer 312 for programming. For example, 532 bytes of data could be input in one embodiment. That data is latched in the appropriate registers for the selected bit lines. In some embodiments, the data is also latched in a second register for the selected bit lines to be used for verify operations. At step 356, a "program" command is issued by the controller and input to data input/output buffer 312. The command is latched by state machine 316 via the command latch signal input to command circuits 314.

Triggered by the "program" command, the data latched in step 354 will be programmed into the selected memory cells controlled by state machine 316 using the stepped pulses of FIG. 6 applied to the appropriate word line. At step 358, $V_{pgm}$, the programming pulse voltage level applied to the selected word line, is initialized to the starting pulse (e.g., 12V) and a program counter PC maintained by state machine 316 is initialized at 0. At step 360, the first $V_{pgm}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 362, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 364, it is checked whether all of the data latches are storing logic "1." If so, the programming process is complete and successful because all selected memory cells were programmed and verified to their target states. A status of "PASS" is reported at step 366.

If, at step 364, it is determined that not all of the data latches are storing logic "1," then the programming process continues. At step 368, the program counter PC is checked against a program limit value. One example of a program limit value is 20, however, other values can be used in various implementations. If the program counter PC is not less than 20, then it is determined at step 369 whether the number of bits that have not been successfully programmed is equal to or less than a predetermined number. If the number of unsuccessfully programmed bits is equal to or less than the predetermined number, then the programming process is flagged as passed and a status of pass is reported at step 371. The bits that are not successfully programmed can be corrected using error correction during the read process. If however, the number of unsuccessfully programmed bits is greater than the predetermined number, the program process is flagged as failed and a status of fail is reported at step 370. If the program counter PC is less than 20, then the $V_{pgm}$ level is increased by the step size and the program counter PC is incremented at step 372. After step 372, the process loops back to step 360 to apply the next $V_{pgm}$ pulse.

Figure 12:
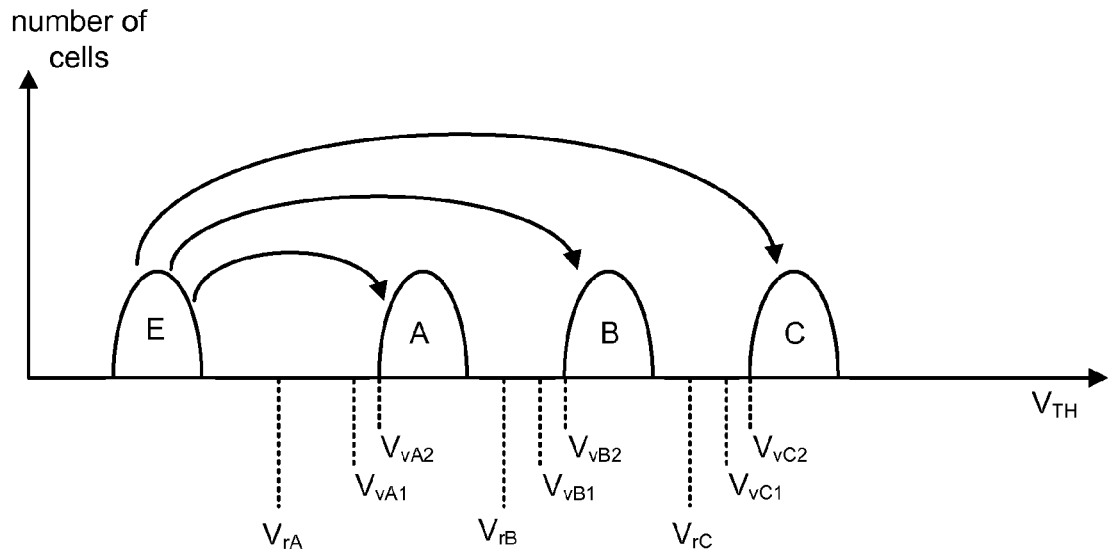
FIG. 12 depicts an exemplary set of threshold voltage distributions and a full sequence programming process.

At the end of a successful program process, the threshold voltages of the memory cells should be within one or more distributions of threshold voltages for programmed memory cells or within a distribution of threshold voltages for erased memory cells, as appropriate. FIG. 12 illustrates threshold voltage distributions for the memory cell array when each memory cell stores two bits of data. FIG. 12 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 12 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 12 shows four states, embodiments in accordance of the present disclosure can include other multi-state structures including those that include more or less than four states.

FIG. 12 also depicts an embodiment that utilizes full sequence programming. In full sequence programming, memory cells can be programmed from the erase state E directly to any of the programmed states A, B or C. For example, a population of memory cells to be programmed may first be erased so that all memory cells in the population are in erased state E. The process described in FIG. 11 using a series of program voltage pulses applied to the control gates of selected memory cells will be used to program the memory cells directly into states A, B or C. While some memory cells are being programmed from state E to state A, other memory cells are being programmed from state E to state B and/or from state E to state C.

Figure 13:
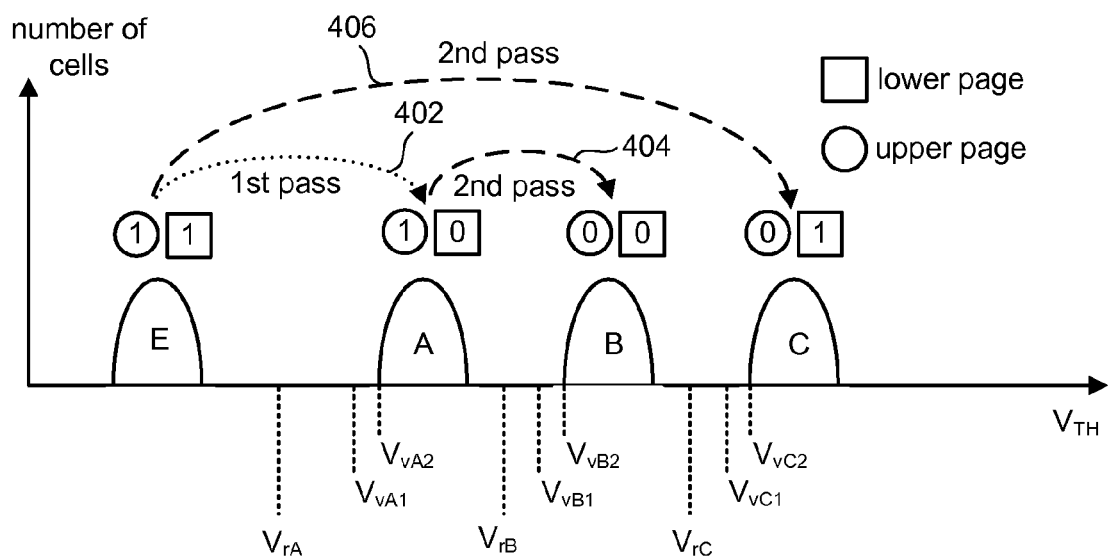
FIG. 13 depicts an exemplary set of threshold voltage distributions and a two-pass programming process.

FIG. 13 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is logic "1," the threshold voltage is not changed since it is in the appropriate state as a result of having been earlier erased. However, if the bit to be programmed is logic "0," the threshold level of the cell is increased to be state A, as shown by arrow 402. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be logic "0," then the threshold voltage is shifted. If the first pass resulted in the cell remaining in the erased state E, then in the second phase the cell is programmed so that the threshold voltage is increased to be within state C, as depicted by arrow 406. If the cell had been programmed into state A as a result of the first programming pass, then the memory cell is further programmed in the second pass so that the threshold voltage is increased to be within state B, as depicted by arrow 404. The result of the second pass is to program the cell into the state designated to store logic "0" for the upper page without changing the data for the lower page. In a two-pass programming method multiple programming or verification steps may be used in a single iteration of the method described in FIG. 11. Steps 358-372 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state. In some embodiments, this technique may include separate data load and program commands as well as separate inputs of address and program data as shown in steps 350-356.

Figure 14A:
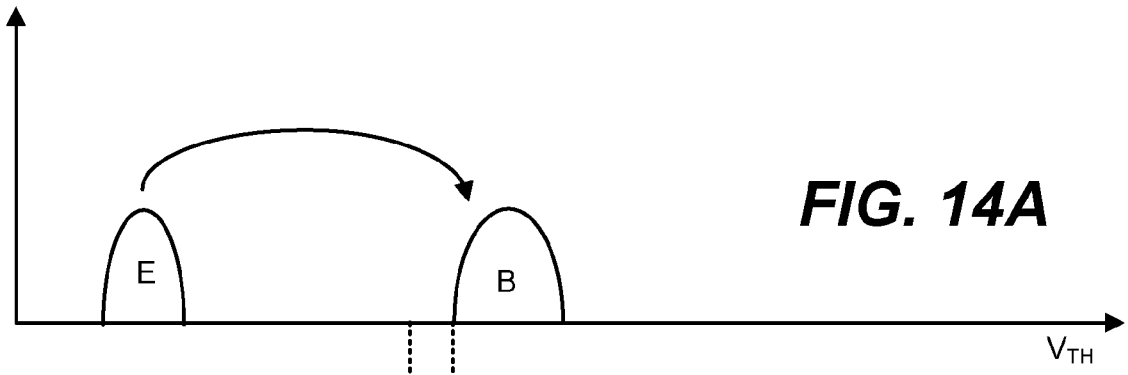
FIGS. 14A-14C depict an exemplary set of threshold voltage distributions and another two-pass programming process.
Figure 14B:
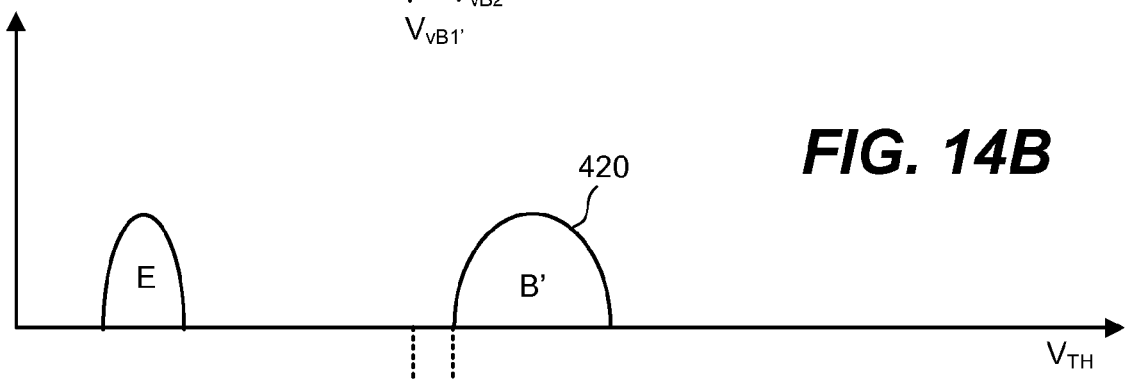
Figure 14C:
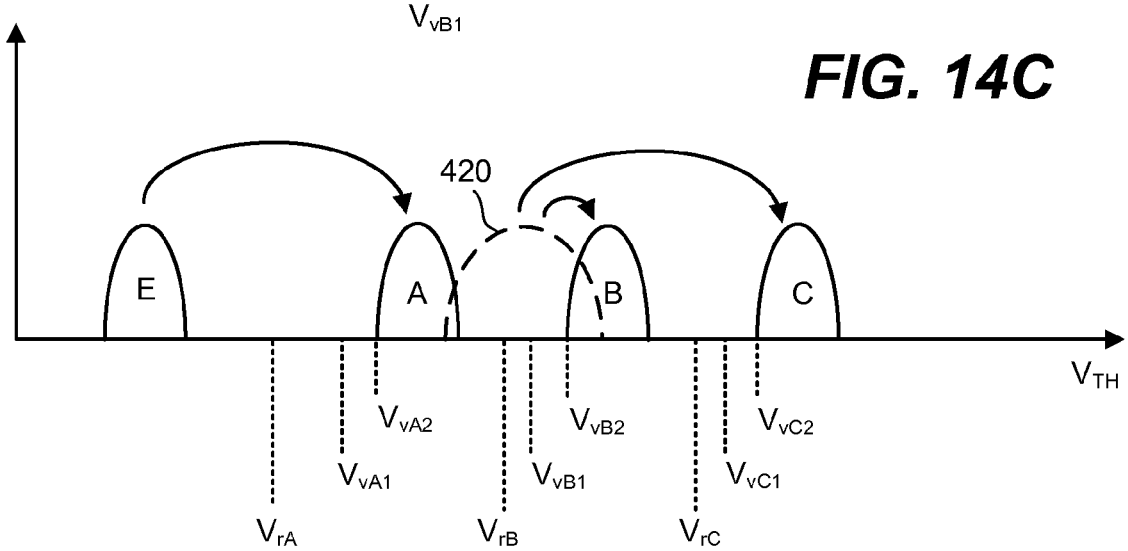

FIGS. 14A-14C disclose another process for programming non-volatile memory that reduces floating gate to floating gate coupling, for any particular memory cell, by writing to that particular memory cell with respect to a particular page subsequent to writing to adjacent memory cells for previous pages. In one example of an implementation of the process taught by FIGS. 13A-13C, the non-volatile memory cells store two bits of data per memory cell, using four data states. For example, assume that state E is the erased state and states A, B and C are the programmed states. State E stores data 11. State A stores data 01. State B stores data 10. State C stores data 00. Other encodings of data to physical data states can also be used. Each memory cell stores two pages of data. For reference purposes these pages of data will be called upper page and lower page, however, they can be given other labels. With reference to state A for the process of FIGS. 14A-14C, the upper page stores bit 0 and the lower page stores bit 1. With reference to state B, the upper page stores bit 1 and the lower page stores bit 0. With reference to state C, both pages store bit data 0. The programming process of FIGS. 14A-14C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to interim state B'. FIG. 14B shows the programming of memory cells from state E to state B'. State B' depicted in FIG. 14A is an interim state B'. Therefore, the verify point is depicted as $V_{vB}'$, which is lower than $V_{vB}$.

In one embodiment, after a memory cell is programmed from state E to state B, its neighbor memory cell in the NAND string will then be programmed with respect to its lower page. For example, looking back at FIG. 7, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B. This will have the effect of widening the threshold voltage distribution for state B to that depicted as threshold voltage distribution 320 of FIG. 14B. This apparent widening of the threshold voltage distribution will be remedied when programming the upper page.

FIG. 14C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 320 and the upper page data is to remain at 1, then the memory cell will be programmed to final state B. If the memory cell is in intermediate threshold voltage distribution 320 and the upper page data is to become data 0, then the threshold voltage of the memory cell will be raised so that the memory cell is in state C. The process depicted by FIGS. 14A-14C reduces the effect of floating gate to floating gate coupling because only the upper page programming of neighboring memory cells will have an effect on the apparent threshold voltage of a given memory cell.

Although FIGS. 14A-14C provide an example with respect to four data states and two pages of data, the concepts taught by FIGS. 14A-14C can be applied to other implementations with more or less than four states and different numbers of pages.

FIGS. 12, 13 and 14A-14C show read reference voltages, $V_{rA}$, $V_{rB}$ and $V_{rC}$ for reading data from memory cells. By testing whether the threshold voltage of a given memory cell is above or below $V_{rA}$, $V_{rB}$ and $V_{rC}$, the system can determine what state the memory cell is in. A cell that conducts with an applied control gate voltage ($V_{cg}$) of $V_{rA}$ is in state E, a cell that conducts at $V_{rB}$ but not $V_{rA}$ is in state A, a cell that conducts at $V_{rC}$ but not $V_{rB}$ is in state B, and a cell that does not conduct at $V_{rA}$, $V_{rB}$ or $V_{rC}$ is in state C.

In read and verify operations, the select gates of a selected block are raised to one or more select voltages and the unselected word lines (e.g., WL0, WL2 and WL3) are raised to a read pass voltage $V_{read}$ (e.g. 4.5 volts) to make the transistors operate as pass gates. The source and p-well are at zero volts. The selected bit lines (BLe) are pre-charged to a level of, for example, 0.7V. The selected word line (e.g. WL1) is connected to a read or verify voltage, a level of which is specified for each read and verify operation in order to determine whether a threshold voltage of the concerned memory cell is above or below such level. If the threshold voltage is higher than the read or verify level on the word line, the potential level of the bit line (BLe) associated with the cell of interest maintains the high level because of the non-conductive memory cell. On the other hand, if the threshold voltage is lower than the read or verify level, the potential level of the concerned bit line (BLe) decreases to a low level, for example less than 0.5V, because of the conductive memory cell discharging the bitline. The state of the memory cell is thereby detected by a voltage comparator sense amplifier that is connected to the bit line to sense the resulting bit line voltage.

The erase, read and verify operations described above are performed according to techniques known in the art. Thus, many of the details explained can be varied by one skilled in the art. Other erase, read and verify techniques known in the art can also be used.

FIGS. 12, 13 and 14A-14C also show verify voltages including $V_{vA2}$, $V_{vB2}$ and $V_{vC2}$. When programming memory cells to state A, the system will test whether those memory cells have a threshold voltage greater than or equal to $V_{vA2}$ to verify that they have reached their final target level. When programming memory cells to state B, the system will test whether the memory cells have threshold voltages greater than or equal to $V_{vB2}$ to verify that they have reached their final target level. When programming memory cells to state C, the system will determine whether memory cells have their threshold voltage greater than or equal to $V_{vC2}$ to verify that they have reached their final target level.

As previously described, coarse/fine programming uses two sets of verify voltages for one or more of the programmable states to both verify the final level of programming for a memory cell and additionally, to switch cells from the coarse programming phase to the fine programming phase when the cell has become close to, but has not yet reached the final verify level for its intended state. In FIGS. 12, 13 and 14A-14C two sets of verify levels are depicted for each programmed state. Verify levels $V_{vA1}$, $V_{vB1}$ and $V_{vC1}$ are used to verify that a memory cell has reached the coarse verify level while verify levels $V_{vA2}$, $V_{vB2}$ and $V_{vC2}$ are used to verify that a memory cell has reached the final verify level for its intended state. Cells that have not reached either of the verify levels for their intended state undergo full or coarse programming during the next iteration of the programming process. Cells that have reached the coarse verify level but not the final verify level for their intended state undergo reduced or fine level programming during the next programming iteration. Cells that have reached the final verify level for their intended state are inhibited from programming during the next programming iteration. Although two sets of verify levels are depicted for each of the programmable states in FIGS. 12, 13, and 14A-14C, some embodiments may not use a coarse verify level for one or more of the states. For example, some implementations will not use coarse verify levels for the highest programmable state since there is no higher state from which it must be differentiated during reading. Such embodiments are contemplated.

FIG. 15 is a timing diagram depicting various signals that are applied to a non-volatile memory device during part of an exemplary programming process that includes coarse\fine programming. The first period of time labeled "programming" includes the signals that are applied to program one or more memory cells of a selected word line WL_sel. This programming period is generalized and as such, might correspond to the first programming pulse applied to the word line or a second or later programming pulse. This period corresponds to step 360 in FIG. 11. The programming period begins by raising the source line to a low positive voltage on the order of about 1V. Next, the drain select gate is opened (or turned on) by applying VSG (e.g., 3.5V) to the drain select gate line SGD. After opening the drain select gate an inhibit voltage $V_{inhibit}$ is applied to any unselected word lines. In FIG. 15 an odd/even programming methodology or architecture is assumed. Bit line $BL_n$ represents the selected bit line. Therefore the adjacent bit lines $BL_{n+1}$, $BL_{n+3}$, etc. and $BL_{n-1}$, $BL_{n-3}$, etc. of the block will be unselected throughout the programming operation. Typically, all like bit lines (e.g., odd or even) are read and programmed simultaneously such that all bit lines $BL_n$, $BL_{n+2}$, etc. will receive the same signals applied to $BL_n$.

The unselected bit lines are raised to an inhibit voltage $V_{inhibit}$ where they remain throughout during the first programming period. The selected bit line $BL_n$ is set up or biased according to the data to be programmed into the memory cell of the selected word line at that particular bit line. If the memory cell of bit line $BL_n$ is to be inhibited from programming $BL_n$ is raised to the voltage level $V_{inhibit}$. In one embodiment, $V_{inhibit}$ is equal to $V_{DD}$ (e.g., 1.8V-3.3V). If the memory cell of bit line $BL_n$ is to be enabled for full or coarse programming $BL_n$ is raised to an enable voltage $V_{enable}$. In one embodiment, $V_{enable}$ is equal to ground or 0V. If the memory cell of bit line $BL_n$ has reached the coarse verify level for the state to which it is to be programmed but has not reached the final verify level for that state, its bit line is raised to an intermediate level $V_S$. $V_S$ is equal to about 2.0V in one embodiment. The value of $V_S$ can vary by embodiment and is dependent upon the level of $V_{inhibit}$ and other device characteristics. The solid line 450 in FIG. 15 represents the situation where the bit line $BL_n$ is raised to $V_{inhibit}$ to inhibit programming of the memory cell at the selected word line. The dotted line 452 represents the situation where bit line $BL_n$ is raised to $V_S$ to permit partial or fine level programming of the memory cell at the selected word line. The dashed 454 line represents the situation where bit line $BL_n$ receives the $V_{enable}$ voltage to permit full or coarse level programming of the memory cell at the selected word line.

After biasing each of the selected bit lines according to the amount of programming to be applied to the memory cell thereof, the word lines are biased. The unselected word lines, denoted as WL_unsel, are raised to a pass voltage $V_{pass}$. The voltage $V_{pass}$ enables boosting of the NAND string channel for those NAND strings having a memory cell that is to be inhibited from programming during this programming period. The selected word line WL_sel is also raised to the voltage $V_{pass}$ to enable boosting of the channels for those NAND strings containing a memory cell at $WL_n$ that is not to undergo programming. After raising each word line to the $V_{pass}$ level, the selected word line is raised to the program voltage pulse level $V_{pgm1}$. After applying the programming pulse to the selected word line all of the word lines are lowered to 0V. After lowering the word lines to 0V the unselected and selected bit lines are each lowered to 0V. The drain side select gate is then turned off by applying 0V to the drain select gate line SGD. The programming period is completed by lowering the source line voltage from 1V to 0V.

The verification operation following the first programming period in FIG. 15 begins after applying the voltage pulse $V_{pgm1}$. The verification operation is divided into coarse level verification and fine level verification as indicated in FIG. 15. Coarse level verification begins by pre-charging the selected bit line $BL_n$, (along with each other selected bit line) to a pre-determined voltage level $V_{clamp}$. $V_{clamp}$ is equal to about 0.7V in one embodiment. Once the bit line is pre-charged, the word lines are biased for coarse level sensing. The unselected word lines are supplied with a read pass voltage $V_{read}$. $V_{read}$ is a pass voltage that ensures that the unselected memory cells will turn on or be conductive during the verification process regardless of the state to which they are programmed. This permits verification for just the memory cells at word line WL_sel. At the same time that $V_{read}$ is applied to the unselected word lines, the selected word line is supplied with the coarse level verification voltage $V_{v1}$ After applying the appropriate bias conditions to each of the word line, the drain side select gate and the source side select gate are both turned on by applying $V_{SG}$ to the drain select gate line SGD and the source select gate line SGS. It should be noted that in FIG. 15 a generalized description is provided without regard to any particular state. Thus $V_{v1}$ may correspond to the coarse verify level for state A, state B, state C or another state.

After pre-charging the selected bit lines, biasing the word lines, and turning on the select gates, the selected bit lines are free to discharge in accordance with the state of the memory cell of that bit line that is also connected to the selected word line WL_sel. The dashed line 454 represents a memory cell whose threshold voltage $V_{th}$ is below the coarse verify level, $V_{v1}$. Because the memory cell has a threshold voltage below the coarse verify level, it will turn on under application of the verify level to permit conduction between bit line and source line through the NAND string. Accordingly, the bit line of such a memory cell will discharge from the pre-charge level $V_{clamp}$ down to about 0.5V or lower, depending on implementation. In FIG. 15, a discharge down to 0V is depicted. The solid line 450 represents a memory cell at $BL_n$ having a threshold voltage above the coarse verify level $V_{v1}$. A memory cell having a threshold voltage above the coarse verify level $V_{v1}$ will not turn on and the bit line voltage will remain substantially at $V_{clamp}$. Sensing is performed on the selected bit line after a predetermined period of time following opening of the drain side select gate. The sense operation senses the voltage on the bit line and compares it with a reference potential $V_{sense}$. The sense amplifier for each selected bit line determines whether the threshold voltage of the memory cell at WL_sel is above the verify level $V_{v1}$ based on this comparison. If the bit line voltage discharges to below $V_{sense}$ it is indicative of a memory cell having a threshold voltage below $V_{v1}$. If the bit line voltage does not discharge below $V_{sense}$, it is indicative of a memory cell having a threshold voltage above $V_{v1}$. After sensing the bit line voltage and comparing it to $V_{sense}$ the coarse level verification process is completed.

In the embodiment of FIG. 15 the bit line is not pre-charged again after coarse level verification. The selected word line is raised directly from the coarse verify level to the final or fine verify level $V_{v2}$. As with the coarse verify level, Vv2 is presented for a generalized description and might include the final verify level for state A, state B, etc. This technique enables efficient verification by eliminating the time needed to pre-charge the selected bit lines. It also eliminates the need to produce the energy for again charging the bit lines. After applying the final verify level $V_{v2}$ to the selected word line, the selected bit lines will discharge in accordance with the state of the memory cell at word line WL_sel. The dotted line 452 in FIG. 15 represents a memory cell having a threshold voltage below the final verify level $V_{v2}$ but above the coarse verify level $V_{v1}$. Such a memory cell will not cause discharge with the coarse verify level applied, but will discharge the bit line when the final verify level is applied. The bit line voltage of these memory cells will discharge from the pre-charge level to about 0.5V or lower during the fine level verification. The solid line 450 continues to represent a memory cell having a threshold voltage below the coarse verify level as well as the final verify level $V_{v2}$.

The bit line voltage is again sensed after a predetermined amount of time following application of $V_{v2}$. This predetermined amount of time may be expressed or set as a period of time following the opening of the select gate during coarse level sensing or as a period of time following the application of the final verify level. The sensed voltage is compared to the reference potential $V_{sense}$. If the bit line voltage does not discharge below $V_{sense}$, the memory cell is determined to have a threshold voltage above the final verify level $V_{v2}$. If the bit line does discharge below $V_{sense}$, the memory cell is determined to have a threshold voltage below the final verify level $V_{v2}$. After sensing, the selected bit lines are lowered to 0V, followed by lowering the word lines to 0V. The drain and source select gate lines are then lowered to 0V to complete the fine verification process.

It is noted that if a multi-state memory device is utilized the coarse level verification and fine level verification processes will be repeated as many times as necessary for the corresponding states. For instance, a four state device may require performance of the coarse and fine level verifications three times—once at the A state verify levels, once at the B state verify levels, and once at the C state verify levels. After completing fine level verification for the A state, the bit line will again be pre-charged and the process repeated. After completing fine level verification for the B state, the bit line will be pre-charged again to begin coarse level verification for state C. Some embodiments may not sense at each state verify level during each process. For instance, reading just the upper page data of memory cells as shown in FIG. 13 only requires sensing at the state B verify levels.

FIG. 15 shows an additional iteration of the programming process that may be used to further program memory cells that have not yet reached their final verify levels after raising the source potential to 1V. The drain side select gate is turned on by applying $V_{SG}$ to the drain source select gate line SGD. The unselected bit lines $BL_{n+1}/BL_{n-1}$ are raised to $V_{inhibit}$. The selected bit line $BL_n$ is then biased according to the results of the previous verification operation and the data to be programmed therein. The arrows shown in FIG. 15 illustrate the corresponding bit line voltage levels that are applied during this next programming iteration. A memory cell that discharged its bit line under application of the coarse verify level (dashed line 454) is supplied with an enable voltage $V_{enable}$ so that the memory cell can undergo full programming during the next iteration. A memory cell that did not discharge its bit line under either the coarse verify level or the final verify level (solid line 450) is indicative of a memory cell that has reached its final verify level. Accordingly the memory cell's bit line is biased to $V_{inhibit}$. Those memory cells that did not discharge their corresponding bit line under the coarse verify level but did discharge the bit line under the final verify level (dotted line 452) are raised to the intermediate voltage level $V_S$ so that they can undergo fine programming during the next programming iteration.

After biasing each selected bit line, the unselected and selected word lines are raised to their pass voltage levels $V_{pass}$. The selected word line is then ramped to the second programming voltage pulse level $V_{pgm2}$. The second pulse is typically increased over the preceding pulse by a step size $V_{pgm1}$. After applying $V_{pgm2}$, the word lines are brought back down to 0V. The selected and unselected bit lines are also brought back to 0V, and the drain select gates turned off. The source line potential is then lowered to 0V. Again it is noted that the embodiment depicted in FIG. 15 may represent only a portion of the programming and verification process in a typical implementation. One or more program voltage pulses may be applied to program each selected memory cell to its target level with coarse and fine level verification at the appropriate levels performed between applications of each pulse.

Figure 16:
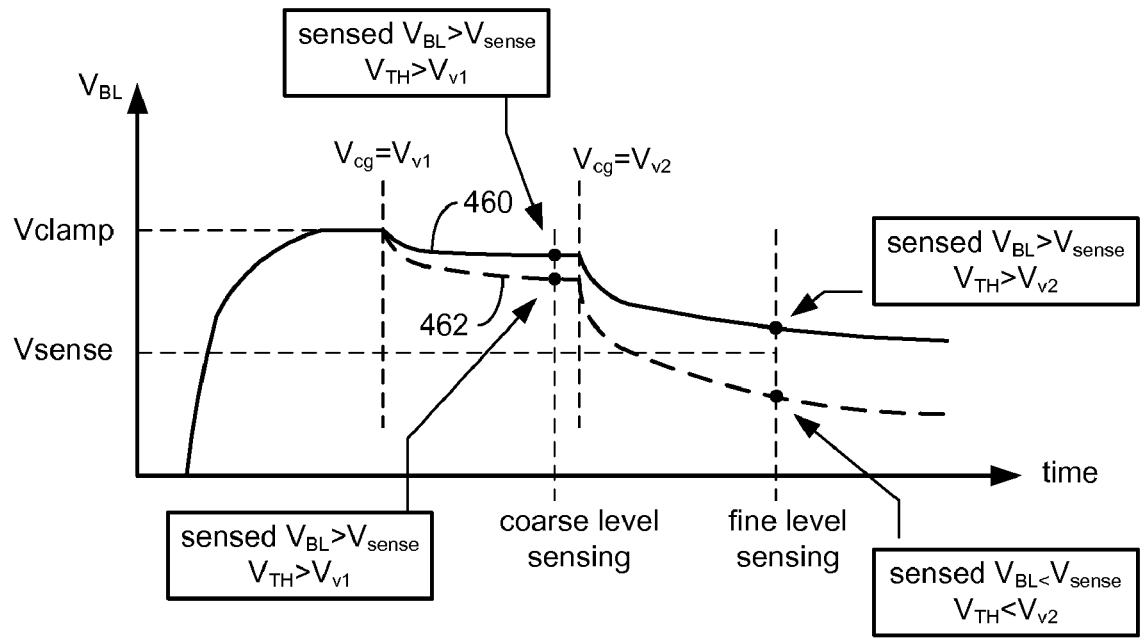
FIG. 16 is a graph describing the bit line potential of different memory cells during a verification operation where the memory cells have small sub-threshold swing factors.

FIG. 16 is a graph showing more details of the coarse level and fine level sense operations for a particular state as may be performed in FIG. 15 and during step 362 of FIG. 11. The graph in FIG. 16 plots the bit line voltage $V_{BL}$ as a function of time. Two different memory cells are represented in the timing diagram of FIG. 16. The solid line 460 represents a memory cell having a threshold voltage just above the final verify level for the state to which it is to be programmed prior to the sensing operation. With reference to FIG. 12, for example, the solid line may represent a memory cell targeted for state B having a threshold voltage just above the final verify level $V_{vB2}$. The dashed line 462 represents a memory cell having a threshold voltage just below the final verify level for the state to which it is to be programmed. For example, the dashed line can represent a memory cell having a threshold voltage just below the final verify level $V_{vB2}$. Both of the depicted memory cells have a threshold voltage that is above the coarse verify level for the state to which they are being programmed.

The bit lines for both memory cells are pre-charged to the pre-determined level $V_{clamp}$. The coarse verify level $V_{v1}$ (e.g., $V_{cg}=V_{vB1}$) is then applied to the selected word line. The drain select gates are then turned on to connect each NAND string to its bit line. As FIG. 16 illustrates, the bit lines will experience some discharge even though each memory cell has a threshold voltage above the coarse verify level. Despite application of a control gate voltage ($V_{cg}$) that is lower than their threshold voltage, transistor-based memory cells will still conduct some amount of current between their source and drain. Memory cells, particularly those fabricated at the small sizes of modern devices, are not always placed into an absolute off condition under application of a positive gate bias. The degree to which a transistor will conduct current with its applied gate voltage below its threshold voltage is referred to as the sub-threshold swing factor (S-factor) of the device.

Traditionally, commercially fabricated memory cells have exhibited low sub-threshold swing factors. FIG. 16 represents a memory device having a low sub-threshold swing factor such that the memory cell does not conduct a significant amount of current under an applied control gate voltage less than its threshold voltage. The threshold voltage of the memory cell will naturally affect the level of conduction, even when the gate voltage is below the threshold voltage. Accordingly, the memory cell of FIG. 16 that has a threshold voltage just above the final verify level (solid line 460) discharges by a smaller amount than the memory cell that has a threshold voltage just below the final verify level (dashed line 462).

After a predetermined amount of time following the drain select gate being opened, a sense operation is performed at the coarse verify level. The bit line voltage is sensed and compared with the reference potential $V_{sense}$. For both cells depicted in FIG. 16, it is determined that the bit line voltage $V_{BL}$ is larger than the sense voltage $V_{sense}$ during coarse level sensing. Accordingly, the sense amplifier determines that each memory cell has a threshold voltage above the coarse verify level $V_{v1}$.

After sensing at the coarse verify level, the final verify level is applied to the selected word line. The control gate of each memory cell is supplied with the final verify voltage $V_{v2}$ (e.g, $V_{cg}=V_{vB2}$). The memory cell having a threshold voltage above the final verify level does not turn on, and thus, the bit line voltage of the cell does not discharge by a significant amount under application of this final verify level. Again, the bit line voltage will discharge to some degree because of the sub-threshold swing factor, however, the discharge is not so significant that the accuracy of the sensing is impacted. The memory cell having a threshold voltage below the final verify level $V_{v2}$ is turned on and conductive under application of the final verify level. Accordingly, the bit line of this memory cell discharges by a significant amount with the final verify level applied.

After a predetermined amount of time following application of the final verify level, the bit line voltage of each memory cell is sensed. Again, this predetermined time may be established relative to opening of the drain select gate for the coarse level sensing or relative to application of the final verify voltage. The memory cell represented by solid line 460 has a bit line voltage that is determined to be larger than $V_{sense}$. Accordingly the sense amplifier determines that the threshold voltage of the cell is larger than the final verify level $V_{v2}$. Such a cell can be inhibited from further programming during any subsequent programming iterations needed for other cells. The memory cell represented by dashed line 462 has a corresponding bit line voltage below the reference potential $V_{sense}$ after the predetermined amount of time. The sense amplifier for this cell will determine that the bit line voltage is below the reference potential $V_{sense}$, and thus, that the threshold voltage of the memory cell is below the final verify level $V_{v2}$.

Figure 17:
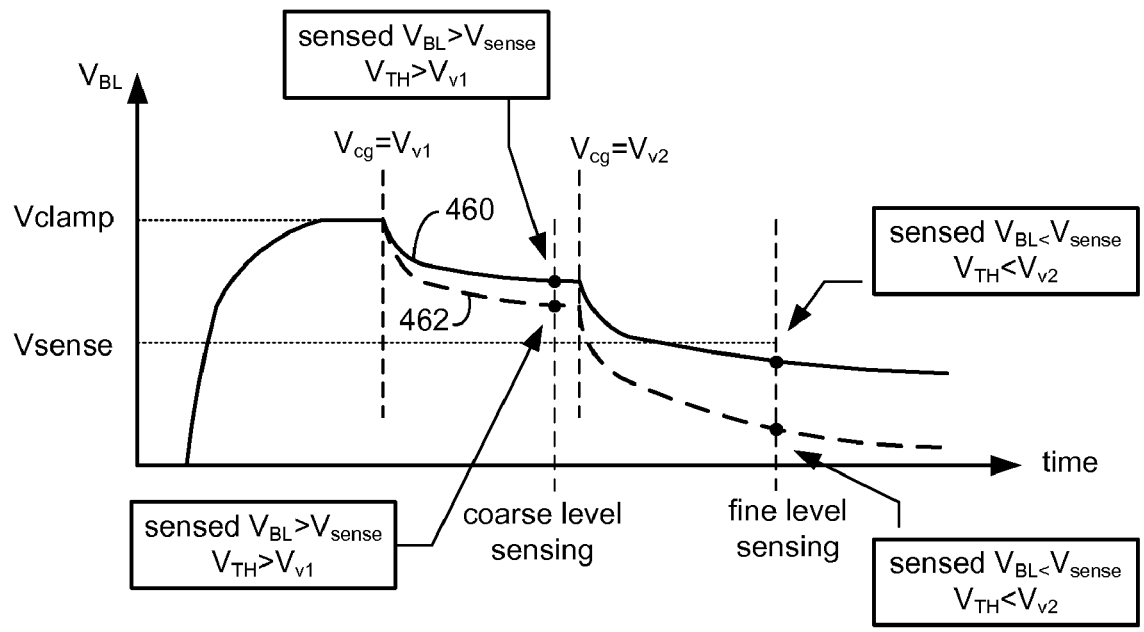
FIG. 17 is a graph describing the bit line potential of different memory cells during a verification operation where the memory cells have larger sub-threshold swing factors.

FIG. 17 is a graph representing a memory device that has a large sub-threshold swing factor. Again, a memory cell having a threshold voltage just above the final verify level is represented by solid line 460, while a memory cell having a threshold voltage just below the final verify level is represented by dashed line 462. The bit line voltage of each memory cell is pre-charged and the coarse verify level is applied to the selected word line. After applying the coarse verify level, the drain side select gate is turned on to connect the bit line to the NAND string of the cell. Because of the large S-factor for the device of FIG. 17 both memory cells cause a significant decrease in the voltage of their bit line even though the threshold voltage of both memory cells is above the coarse verify level $V_{v1}$. After a predetermined amount of time, the bit line voltage is sensed and compared with the reference potential $V_{sense}$. The sense amplifiers for each cell determine that both of these memory cells have a threshold voltage above the coarse verify level $V_{v1}$ since the bit lines did not discharge to below $V_{sense}$.

After coarse level sensing, the selected word line is supplied with the final verify level $V_{v2}$. The memory cell having a threshold voltage just above the final verify level (solid line 460) is not as conductive as the memory cell having a threshold voltage just below the final verify level (dashed line 462). As illustrated in FIG. 17, however, the large S-factor associated with the memory causes the bit line voltage of the memory cell having a threshold voltage above the final verify level to discharge to below $V_{sense}$. The memory cell having a threshold voltage below the final verify level also discharges its bit line to below $V_{sense}$, as expected. During fine level sensing, the sense amplifier for the memory cell having a threshold voltage above the final verify level determines that the cell's bit line has discharged to below $V_{sense}$. Accordingly the sense amplifier determines that the memory cell has a threshold voltage below the final verify level. This represents an error in the sense operation. The sense circuitry will incorrectly determine that the memory cell is not yet programmed to its final target level and will cause the cell to undergo further programming. The memory cell represented by the dashed line also has a sensed bit line voltage below $V_{sense}$. The sense amplifier for this cell correctly determines that the threshold voltage of the cell is below the final verify level $V_{v2}$.

Figure 18:
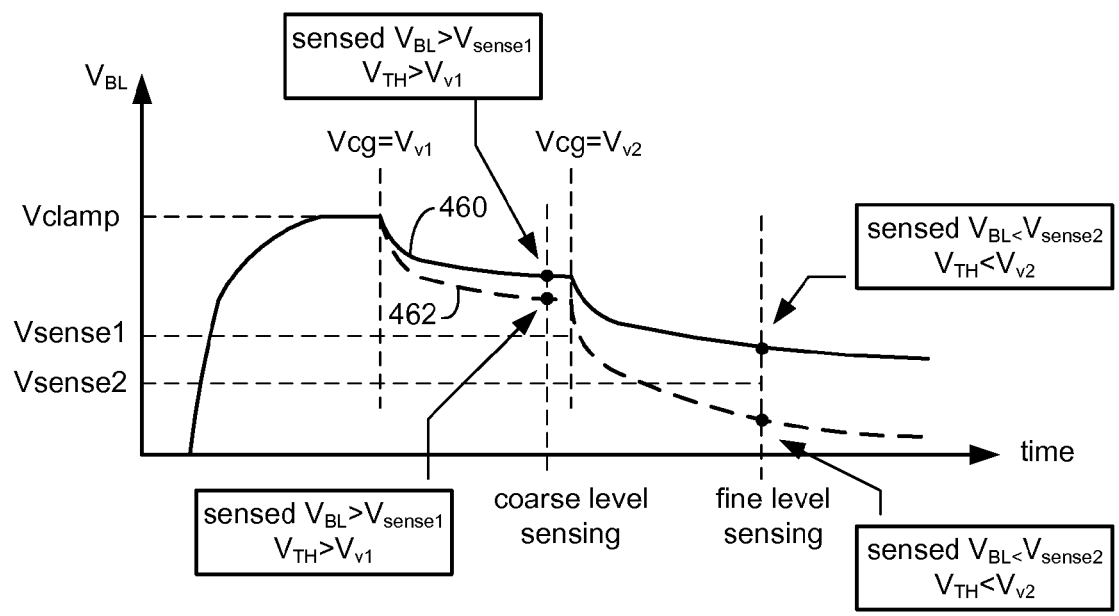
FIG. 18 is a graph describing the bit line potential of different memory cells during a verification process in accordance with one embodiment.

FIG. 18 is a graph of a coarse and fine verify and sensing approach in accordance with one embodiment of the present disclosure that can address bit line discharge resulting from large S-factor devices. The solid line 460 again represents a memory cell having a threshold voltage just above the final verify level (e.g., $V_{vA2}$). The dashed line 462 represents a memory cell having a threshold voltage just below the final verify level. The bit line voltage of each memory cell is pre-charged to the predetermined level $V_{clamp}$. After pre-charging both bit lines the selected word line is supplied with the coarse verify level $V_{v1}$ (e.g., $V_{cg}=V_{vA1}$). The drain side select gate is then turned on to allow the bit line to discharge. The memory cell having a threshold voltage above the final verify level will again experience a somewhat significant decrease in bit line voltage because of the large S-factor. Similarly the memory cell having a threshold voltage below the final verify level also experiences a somewhat significant decrease in bit line voltage. After a predetermined amount of time the bit line voltage of each memory cell is sensed and compared with the reference potential. During coarse level sensing, the sensed bit line voltage is compared with an intermediate reference potential $V_{sense1}$. The sense amplifiers for both memory cells will determine that the bit line voltage is greater than the coarse verify level $V_{sense1}$. As a result, the sense amplifiers correctly determine that the threshold voltage of each memory cell is greater than the coarse verify level $V_{v1}$.

After sensing at the coarse verify level, the selected word line is supplied with the final verify level $V_{v2}$. Again, the memory cell having a threshold voltage above the final verify level will conduct a significant amount of current because of the large S-factor of the device. The memory cell having a threshold voltage below the final verify level is even more conductive, as expected, and discharges its bit line by a significant amount.

After a predetermined amount of time the bit line voltage of each memory cell is sensed and compared with a reference potential. During the fine level sensing, a different reference potential is used. The sensed bit line voltage is compared with final reference potential $V_{sense2}$. $V_{sense2}$ is lower than $V_{sense1}$. The lower reference potential compensates for the bit line discharge that occurs under application of the coarse verify level. This compensation takes into account the large S-factor associated with the memory device that causes memory cells to discharge their bit line by a somewhat significant amount, even when the memory cell has a threshold voltage above the verify level. In FIG. 18, the memory cell having a threshold voltage just above the final verify level has its sensed bit line voltage compared with $V_{sense2}$. In this case the sense amplifier will determine that the bit line voltage is greater than the final reference potential $V_{sense2}$. Accordingly, the sense amplifier will correctly determine that the threshold voltage of this memory cell is greater than the final verify level $V_{v2}$. For the memory cell having a threshold voltage just below the final verify level, the sense amplifier compares the sensed bit line voltage with the final reference potential $V_{sense2}$. The sense amplifier for this cell's bit line will determine that the bit line voltage is less than the final reference potential $V_{sense2}$. The sense amplifier will again correctly determine that the memory cell has a threshold voltage below the final verify level $V_{v2}$. Accordingly, by adjusting the level of the reference potential between coarse level sensing and fine level sensing when the bit line is not pre-charged again between each sense operation, a more accurate sensing of the state of the memory cells is achieved. The different in the reference potential levels provides a compensation for the amount of discharge during coarse level sensing.

In one embodiment, the final reference potential $V_{sense2}$ is less than the intermediate reference potential $V_{sense1}$ by an amount that is approximately equal to the expected discharge of the bit line voltage for a memory cell having a threshold voltage above the coarse verify level $V_{v1}$ when $V_{v1}$ is applied to the memory cell's word line during coarse level sensing. A memory cell that is theoretically nonconductive under the applied verify level will have an associated bit line voltage discharge resulting from the large S-factor of the device. The difference between the intermediate and final $V_{sense}$ levels can be set to approximately the difference between the bit line pre-charge level and the bit line voltage that results when the coarse verify level is applied to the word line. In this way, the final reference potential $V_{sense2}$ compensates for the bit line discharge that results from a large S-factor device. Other values of the intermediate reference potential $V_{sense1}$ and final reference potential $V_{sense2}$ can be used according to the requirements of a given implementation. For example, $V_{sense2}$ may be set lower than $V_{sense1}$ by an amount this is smaller than the expected discharge of a bit line for a memory cell when the coarse verify level is applied to the word line. A smaller offset of $V_{sense2}$ relative to $V_{sense1}$ may still accommodate the level of bit line discharge during coarse level sensing. In one embodiment, the intermediate reference potential $V_{sense1}$ is approximately equal to the typical $V_{sense}$ level that would be used when devices have a normal or lower S-factor. In such a case, the final reference potential $V_{sense2}$ is adjusted with reference to $V_{sense1}$ by an amount that can compensate for a decrease in the bit line voltage during the coarse level sensing.

In one embodiment a memory array undergoes testing during the manufacturing process. This testing can include a characterization of the memory array's performance. For instance, the memory array can be measured to determine the amount that the bit lines will discharge when a coarse verify level is applied to the word line and the memory cell's threshold voltage is above this coarse verify level. The amount of discharge associated with multiple bit lines of the device may be averaged to arrive at an appropriate amount in one embodiment. During the manufacturing process the value of $V_{sense2}$ relative to $V_{sense1}$ can be set to accommodate the measured decrease in bit line voltage under application of the coarse verify levels. Additionally, the intermediate reference potential $V_{sense1}$ can be based on the characterization of the memory device. In some embodiments a selected subset of memory devices can be tested and characterized, and the results of the characterization used to set the $V_{sense1}$ and $V_{sense2}$ levels for a larger set of devices including those of the subset. In other embodiments, the manufacturing process can set the levels of $V_{sense1}$ and $V_{sense2}$ for each memory device based on testing and characterization for that particular memory device. It is also possible to set the time period between turning on the select gate and performing the coarse level sensing to optimize accuracy in the coarse level sensing. Likewise, the time period between application of the final verify level to the selected word line and sensing at that level can be selected based on testing and characterization to further provide accurate sensing at both levels. As previously mentioned, the time before sensing during fine level sensing may be established relative to the time the select gates are turned on during coarse level sensing or relative to the time the fine verify level is applied to the selected word line. Various techniques can be used to set these values after the characterization. For instance, a set of anti-fuses, electrically programmable fuses, etc. may be provided within the memory device to store data relative to the operation of the device. These fuses may be set to store data indicating the values of $V_{sense}$ and/or the time periods for sensing.

Figure 19:
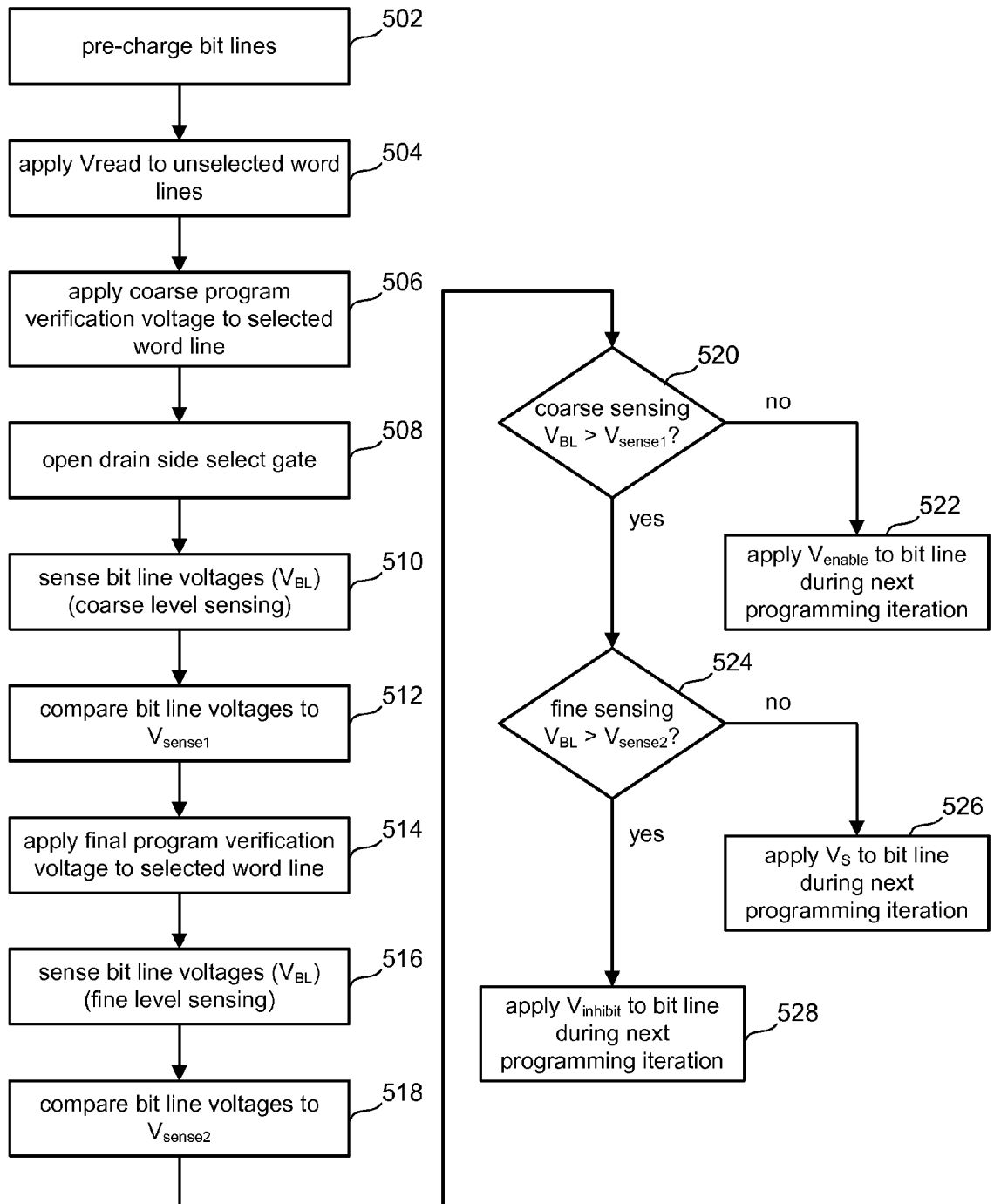
FIG. 19 is a flowchart describing verification of memory cells during coarse/fine programming in accordance with one embodiment.

FIG. 19 is a flowchart describing a process for verifying programming of one or more memory cells. In one embodiment the process of FIG. 19 is performed at step 362 of FIG. 11 after applying each program pulse at step 360. Beginning at step 402, the selected bit lines are pre-charged. In an odd-even architecture where verification and programming is performed for the odd bit lines and the even bit lines at separate times, pre-charging at step 402 can include pre-charging the odd bit lines or the even bit lines. Alternatively some architectures will utilize an all bit line system such that step 502 will include charging each bit line of the selected block of memory cells. After pre-charging the bit lines to a predetermined level, a read pass voltage $V_{read}$ is applied to each unselected word line at step 504. Step 404 ensures conduction of each unselected memory cell during the verification process so that only those memory cells connected to the selected word line will be verified. At step 506 the coarse program verification voltage is applied to the selected word line. Step 506 can include applying a coarse verify level such as $V_{vA1}$, $V_{vB1}$ or $V_{vC1}$ depending upon the number of states of the memory device being programmed. At step 510 the drain side select gate is opened or turned on by applying a positive voltage on SGD. With the drain side select gate opened, the selected bit lines are connected to their NAND strings to permit discharge in accordance with the programmed state of the memory cell on that bit line that is connected to the selected word line. After a predetermined amount of time the voltages of the selected bit lines are sensed at step 510. Step 510 represents coarse level sensing for the memory device. After sensing the bit line voltages for each selected bit line, the bit line voltages are compared to an intermediate reference potential $V_{sense1}$ at step 512. At step 514 the selected word line is provided with the final verification voltage such as $V_{vA2}$, $V_{vB2}$ or $V_{vC2}$ depending upon the state or states that are being verified. At step 516, the voltage of each selected bit line is sensed. Sensing at step 516 represents final or fine level sensing. At step 518, the sensed bit line voltages are compared to the final reference potential $V_{sense2}$.

At step 520 the sense amplifier for each selected bit line will determine if the sensed bit line voltage $V_{BL}$ is greater than the intermediate reference potential $V_{sense1}$ using the results of the comparison at step 518. If the sensed bit line voltage is less than the intermediate reference level, indicating that the memory cell's threshold voltage has not reached the coarse verification level, the memory cell is enabled for full programming at step 522 for the next iteration of the programming process. Step 522 can include applying a $V_{enable}$ voltage (e.g., ground) to the bit line of such a memory cell during the next programming pulse. If the bit line voltage was determined to be greater than $V_{sense1}$ at step 520, the process continues at step 524. The sensed bit line voltage from the fine level sensing at step 516 is compared to the final reference potential $V_{sense2}$. If the sense amplifier for a bit line determines that the bit line voltage is less than the final reference potential $V_{sense2}$, an intermediate voltage $V_S$ is applied to the bit line for the memory cell at step 526 for the next programming iteration. If the sense amplifier determines that the bit line voltage during fine level sensing is greater than the final reference potential $V_{sense2}$ the sense amplifier causes $V_{inhibit}$ to be applied to the bit line at step 528 for the next program iteration.

It is noted that steps 502 through 528 of FIG. 19 can be repeated for the number of verification operations that are needed to be performed in accordance with the number of potential states of the memory device. In a four state memory device that stores two bits of data the verification at step 362 can include three iterations of the method of FIG. 19. The coarse and fine verification operations will be performed once at the state A verify levels, once at the state B verify levels, and once at the state C verify levels. It is further noted that the results of sensing at a particular state's verify levels can be ignored for those selected bit lines that are being programmed to a different state than the one currently being verified.

Figure 20:
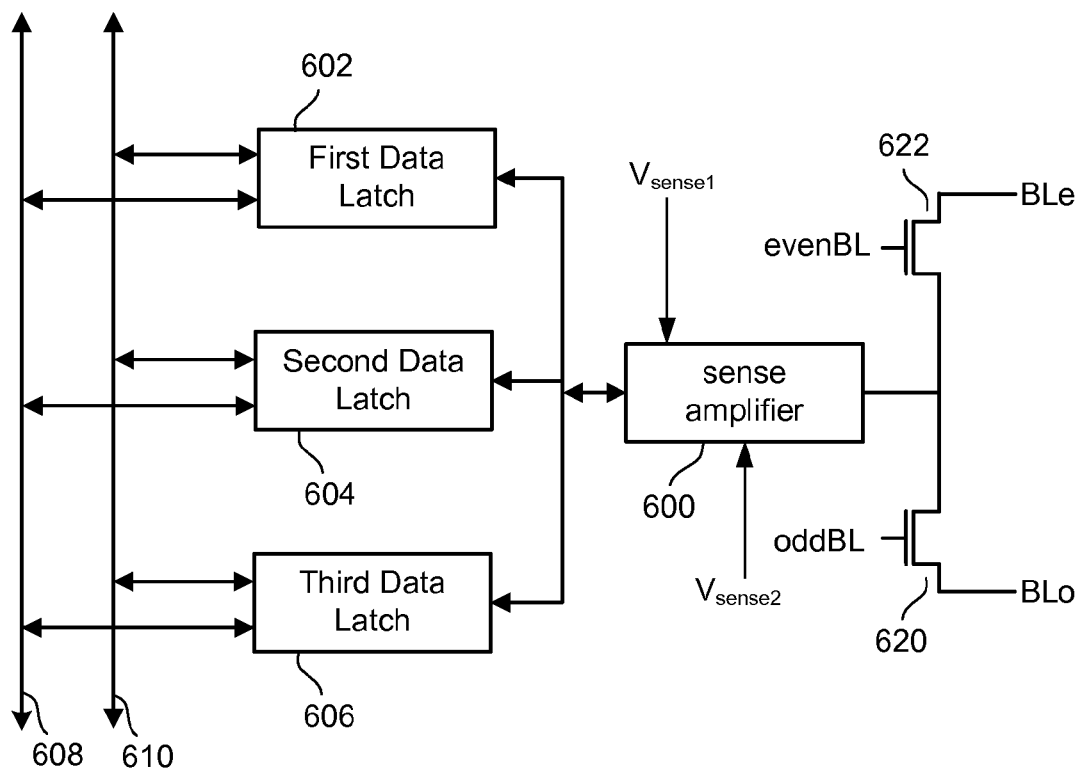
FIG. 20 is a portion of the column control circuitry of a memory device that can be used in accordance with one embodiment.

FIG. 20 depicts a portion of column control circuit 304 of FIG. 8 that includes a sense amplifier. Each pair of bit lines (e.g. BLe and BLo) is coupled to a sense amplifier 600. The sense amplifier is connected to three data latches: first data latch 602, second data latch 604 and third data latch 606. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 602, 604 and 606 are coupled to I/O lines 608 to output read data and to store program data. I/O lines 608 are connected to data input/output buffer 312 of FIG. 8. Data latches 602, 604 and 606 are also coupled to status line(s) 610 to receive and send status information. In one embodiment, there is a sense amplifier, first data latch 602, second data latch 604 and third data latch 606 for each pair (even and odd) of bit lines. In addition to storing read data and program data, the data latches can store the results of sensing in order to provide an enable voltage, inhibit voltage, or intermediate voltage to a bit line in accordance with the sensed state of the storage element relative to its target state, including coarse verify levels and final verify levels. In one embodiment that stores 2 bits of data, two data latches can be used to store the data to be programmed into a memory cell and the remaining data latch used to store an indication of whether a cell is currently in a fine programming phase or coarse programming phase. Sense amplifier 600 can receive the different values of the reference potential to be used during the comparisons for the coarse level verify operation ($V_{sense1}$) and the fine level verify operation ($V_{sense2}$). The appropriate comparison level can be selected based on the data stored in the remaining data latch.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of programming non-volatile memory, comprising:
   applying one or more programming pulses to a set of non-volatile storage elements to program one or more storage elements of the set to a particular state;
   after applying each programming pulse, verifying programming of the one or more storage elements to an intermediate verify level corresponding to the particular state by applying a first voltage to the set of storage elements and comparing a bit line voltage of each of the one or more storage elements to a first reference potential; and
   after applying each programming pulse, verifying programming of the one or more storage elements to a final verify level corresponding to the particular state by applying a second voltage to the set of storage elements and comparing the bit line voltage of each of the one or more storage elements to a second reference potential, the second reference potential compensating for a decrease in the bit line voltage of each of the one or more storage elements resulting from the verifying programming to the intermediate verify level, the first voltage is different from the second voltage, the first reference potential is different from the second reference potential.

2. The method of claim 1, wherein:
   the second reference potential is provided at a level to compensate for a decrease in the bit line voltage of each of the one or more storage elements resulting from the verifying programming to the intermediate verify level when the one or more storage elements are at or above the intermediate verify level.

3. The method of claim 1, wherein the second reference potential is less than the first reference potential by an amount substantially equal to an amount a bit line of the one or more non-volatile storage elements will discharge when the first voltage is applied and the one or more storage elements are at or above the intermediate verify level.

4. The method of claim 1, wherein the second reference potential is less than the first reference potential by an amount substantially equal to an amount of bit line discharge for a storage element at or above the intermediate verify level when the first voltage is applied.

5. The method of claim 1, further comprising:
   pre-charging a set of bit lines in communication with the one or more storage elements after applying each programming pulse and prior to verifying programming to the intermediate verify level;
   wherein verifying programming to the intermediate verify level includes:
   opening a set of select gates in communication with the set of bit lines and the one or more storage elements, and
   sensing the bit line voltage of each of the one or more storage elements a predetermined amount of time following opening the set of select gates; and
   wherein verifying programming to the final verify level includes:
   sensing the bit line voltage of each of the one or more storage elements a different predetermined amount of time following opening the set of select gates.

6. The method of claim 5, wherein:
   the set of non-volatile storage elements is in communication with a first word line; and
   the set of bit lines includes every other bit line in a group of bit lines.

7. The method of claim 1, further comprising:
   pre-charging a set of bit lines in communication with the one or more storage elements after applying each programming pulse and prior to verifying programming to the intermediate verify level;
   wherein verifying programming to the final verify level does not include pre-charging the set of bit lines after verifying programming to the intermediate verify level.

8. The method of claim 7, wherein:
   the set of bit lines includes every other bit line in a group of bit lines.

9. The method of claim 1, further comprising:
   applying one or more additional programming pulses to the set to program one or more different storage elements of the set to a different state; and
   after applying each additional programming pulse, verifying programming of the one or more storage elements to a different final verify level corresponding to the different state, the different final verify level is higher than the intermediate verify level and the final verify level for the particular state.

10. The method of claim 1, wherein applying the one or more programming pulses to the set also programs one or more different storage elements of the set to a different state.

11. The method of claim 1, wherein:
    the set of non-volatile storage elements is a set of NAND flash memory cells.

12. The method of claim 1, wherein:
    the intermediate verify level is a coarse verify voltage.

13. A method of verifying programming of non-volatile storage, comprising:
    charging a bit line corresponding to a non-volatile storage element;
    applying to the non-volatile storage element an intermediate verify voltage corresponding to a target state for the non-volatile storage element;
    sensing a voltage of the bit line while the intermediate verify voltage is applied;

comparing the voltage of the bit line to a first reference potential;

applying to the non-volatile storage element a final verify voltage corresponding to the target state for the non-volatile storage element, the final verify voltage is different from the intermediate verify voltage;

sensing the voltage of the bit line while the final verify voltage is applied and before the bit line completely discharges from the charging; and comparing the voltage of the bit line while the final verify voltage is applied to a second reference potential, the second reference potential is different from the first reference potential.

14. The method of claim 13, further comprising:

applying a programming voltage to the non-volatile storage element after comparing the voltage of the bit line to the second reference potential;

while applying the programming voltage, applying a first potential to the bit line corresponding to the storage element if the voltage of the bit line sensed with the intermediate verify voltage applied is less than the first reference potential;

while applying the programming voltage, applying a second potential to the bit line corresponding to the storage element if the voltage of the bit line sensed with the intermediate verify voltage applied is greater than the first reference potential and the voltage of the bit line sensed with the final verify voltage applied is less than the second reference potential; and while applying the programming voltage, applying a third potential to the bit line corresponding to the storage element if the voltage of the bit line sensed with the final verify voltage applied is greater than the second reference potential.

15. The method of claim 13, wherein:

the first potential is ground;

the second potential is a positive voltage; and the third potential is a larger positive voltage.

16. The method of claim 13, wherein the second reference potential compensates for an expected decrease in the voltage of the bit line from sensing at the intermediate verify voltage when a threshold voltage of the storage element is at or above the intermediate verify voltage.

17. The method of claim 13, wherein the second reference potential is lower than the first reference potential by an amount corresponding to a decrease in bit line voltage when sensing at the intermediate verify voltage for a storage element having a threshold voltage at or above the intermediate verify voltage.

18. A method of programming non-volatile storage, comprising:

charging a bit line associated with a non-volatile storage element;

applying a verify voltage associated with a target state to the storage element;

opening a select gate associated with the non-volatile storage element to permit discharge of the bit line through the storage element;

sensing a voltage of the bit line while the verify voltage is applied and the select gate is open to permit discharge;

determining if the voltage of the bit line is less than a reference voltage;

before closing the select gate, applying a different verify voltage associated with the target state to the storage element;

sensing the voltage of the bit line while the different verify voltage is applied and the select gate is open to continue permitting discharge; and determining if the voltage of the bit line is less than a different reference voltage.

19. The method of claim 18, wherein opening the select gate comprises applying a voltage to the select gate sufficient to turn on the select gate.

20. A method of programming non-volatile storage, comprising:

charging a bit line for a non-volatile storage element;

sensing a voltage of the bit line while applying a first verify voltage to the non-volatile storage element, the first verify voltage associated with a target state for the non-volatile storage element;

comparing the bit line voltage to a first reference voltage;

before charging the bit line after comparing the bit line voltage to a first reference voltage, sensing the voltage of the bit line while applying a second verify voltage to the non-volatile storage element, the second verify voltage is associated with the target state for the non-volatile storage element and is different from the first verify voltage; and comparing the bit line voltage to a second reference voltage, the second reference voltage is different from the first reference voltage.

21. A method of verifying programming of non-volatile memory, comprising:

charging a bit line for a non-volatile storage element to a predetermined level;

electrically coupling the non-volatile storage element to the bit line after charging;

sensing the bit line voltage while the storage element is coupled to the bit line and an intermediate verify voltage is provided to the non-volatile storage element to determine if the bit line voltage is below a first reference potential, the intermediate verify voltage corresponding to a particular state;

sensing the bit line voltage while the storage element is coupled to the bit line and a final verify voltage is provided to the non-volatile storage element to determine if the bit line voltage is below a second reference potential, the final verify voltage is associated with the particular state and is different from the intermediate verify voltage, the second reference potential is different from the first reference potential; and electrically decoupling the non-volatile storage element from the bit line after sensing with the intermediate verify voltage provided to the storage element and sensing with the final verify voltage provided to the storage element.

22. The method of claim 21, wherein:

electrically coupling the non-volatile storage element to the bit line comprises turning on a select gate associated with the storage element; and electrically decoupling the non-volatile storage element from the bit line comprises turning off the select gate associated with the storage element.

* * * * *